United States Patent
Nishimoto et al.

(10) Patent No.: US 8,344,558 B2
(45) Date of Patent: Jan. 1, 2013

(54) PRODUCTION SYSTEM POWER SUPPLY CONTROL METHOD, AND PRODUCTION SYSTEM

(75) Inventors: Tomotaka Nishimoto, Osaka (JP); Kouichi Yabuki, Nara (JP); Ikuo Yoshida, Kyoto (JP); Hiroyuki Kondo, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/390,813

(22) PCT Filed: Mar. 23, 2011

(86) PCT No.: PCT/JP2011/001714
§ 371 (c)(1),
(2), (4) Date: Feb. 16, 2012

(87) PCT Pub. No.: WO2011/121941
PCT Pub. Date: Oct. 6, 2011

(65) Prior Publication Data
US 2012/0146408 A1   Jun. 14, 2012

(30) Foreign Application Priority Data

Mar. 29, 2010   (JP) .................................. 2010-076443

(51) Int. Cl.
*H01H 9/54*   (2006.01)
(52) U.S. Cl. ....................................................... 307/140
(58) Field of Classification Search .................... 307/140
See application file for complete search history.

(56) References Cited

U.S. PATENT DOCUMENTS

| | | | |
|---|---|---|---|
| 6,701,611 B1 | 3/2004 | Izumida et al. | |
| 7,210,222 B2 | 5/2007 | Izumida et al. | |
| 2004/0143964 A1 | 7/2004 | Izumida et al. | |
| 2007/0270992 A1 | 11/2007 | Nishida et al. | |
| 2007/0293969 A1 | 12/2007 | Hirai et al. | |

FOREIGN PATENT DOCUMENTS

| | | |
|---|---|---|
| JP | 2000-307297 | 11/2000 |
| JP | 2001-320199 | 11/2001 |
| JP | 2006-261646 | 9/2006 |
| JP | 2006-310750 | 11/2006 |
| WO | 00/65896 | 11/2000 |
| WO | 2006/080366 | 8/2006 |
| WO | 2006/088032 | 8/2006 |

OTHER PUBLICATIONS

International Search Report issued Apr. 19, 2011 in International (PCT) Application No. PCT/JP2011/001714.
A Reply (First) submitted in International Application No. PCT/JP2011/001714 and its English translation.

*Primary Examiner* — Robert L. Deberadinis
(74) *Attorney, Agent, or Firm* — Wenderoth, Lind & Ponack, LLP

(57) ABSTRACT

A power supply control method of a production system including a first unit and a second unit includes: starting power supply for operation of the second unit in accordance with a signal acquired according to an operation status of the first unit (S41); starting the operation by the second unit after the start of the power supply (S44); acquiring stop time information indicating time from when the operation ends to when a next operation of the second unit starts (S22); determining, based on the acquired stop time information, whether or not to stop the power supply after the started operation ends (S24); and stopping the power supply when it is determined to stop the power supply (S48).

7 Claims, 17 Drawing Sheets

PRODUCTION SYSTEM POWER SUPPLY CONTROL METHOD, AND PRODUCTION SYSTEM

TECHNICAL FIELD

The present invention relates to a power supply control method of a production system that produces a component mounting board through cooperative operation of a plurality of units.

BACKGROUND ART

There are conventionally production systems each of which includes a plurality of units for component mounting and produces a component mounting board through cooperative operation of these plurality of units. Moreover, one of examples of such a production system is a component mounting machine.

The component mounting machine includes: a conveyance unit that conveys a board; a component supply unit that supplies a component to be mounted onto the board; and a mounting unit that mounts the component supplied from the component supply unit onto the board conveyed by the conveyance unit.

Moreover, in recent years, in terms of production cost reduction and global environment protection, there have been demands on production systems of such a component mounting machine for power consumption reduction.

Thus, disclosed is a technology of controlling power supply of a production system including a plurality of units for component mounting to thereby reduce power consumption of the production system (for example, see Patent Literature 1).

With the technology described in Patent Literature 1, in the production system including the plurality of units for the component mounting, in a case where any of the units has stopped its operation due to, for example, component shortage, power supply for operation to this unit is blocked. Such control achieves power consumption reduction of the production system.

CITATION LIST

Patent Literature

[PTL 1] Japanese Patent Application Laid-open No. 2000-307297

SUMMARY OF INVENTION

Technical Problem

With the conventional technology, stopping of the power supply is targeted on time of abnormality occurrence (such as component shortage) that requires stopping for a relatively long period of time.

However, in the production system, even in a state in which normal operation without any problem such as the component shortage continues, some of the units stop their operation in one cycle of work for a relatively large proportion of time.

Power consumption of such a unit while stopped cannot be ignored, and therefore it is also considered to stop the power supply for the operation of this unit every time the unit stops its operation. However, this case raises another problem that production efficiency of the production system deteriorates.

In view of the problem described above, it is an object of the present invention to provide a power supply control method of, without deteriorating production efficiency of a production system that produces a component mounting board through cooperative operation of a plurality of units, increasing the amount of power consumption reduction, and also a production system executing the power supply control method.

Solution to Problem

To achieve the object described above, according to one aspect of the present invention, a power supply control method of a production system including a first unit and a second unit that produce a component mounting board by repeatedly starting and stopping operation in a coordinated manner, includes: starting power supply for the operation of the second unit in accordance with a signal acquired according to an operation status of the first unit; starting the operation by the second unit after the start of the power supply; acquiring stop time information indicating time from when the operation ends to when a next operation of the second unit starts; determining, based on the acquired stop time information, whether or not to stop the power supply after the started operation ends; and stopping the power supply when it is determined to stop the power supply.

With this method, based on the stop time information for the second unit, it is determined whether or not to stop the power supply for the operation of the second unit.

Therefore, even in a case where the production system continues normal operation, within a range not deteriorating production efficiency of the production system, the power supply for the operation of the second unit can be stopped frequently.

Moreover, as a result of the determination described above, even when it has been determined to stop the power supply, in accordance with the signal acquired according to the operation status of the first unit, the power supply is then started. Thus, the second unit can appropriately execute the next operation.

As described above, with the power supply control method, without deteriorating the production efficiency of the production system that produces a component mounting board by repeatedly starting and stopping the operation in an coordinated manner by the plurality of units, the amount of power consumption reduction can be increased.

Moreover, in the power supply control method according to the aspect of the invention, in the determining, it may be determined to stop the power supply when the time indicated by the stop time information is longer than a predetermined threshold value.

With this method, through relatively easy processing of comparing the time indicated by the stop time information with the predetermined threshold value, it can be appropriately determined whether or not to stop the power supply.

Moreover, in the power supply control method according to the aspect of the invention, in the determining, it may be determined to stop the power supply when the time indicated by the stop time information is longer than a sum, as the predetermined value, of (a) time required for stopping the power supply and (b) time required for the second unit to become operable after the start of the power supply.

With this method, if the time from when the given operation of the second unit ends to when the next operation thereof starts is longer than the time actually required for stopping and recovering the power supply, the power supply is stopped. Therefore, in a case where stopping the power supply leads to deterioration in the production efficiency, the power supply can be kept without being stopped.

Moreover, the power supply control method according to the aspect of the invention may further include restarting, in accordance with a signal transmitted from the first unit after the power supply is stopped in the stopping, the power supply before timing that is ahead of supposed timing of starting the next operation by time corresponding to the time required for the second unit to become operable after the start of the power supply.

With this method, in a case where the second unit stops the operation and starts the next operation, at timing of this start, a stable power state is ensured. Thus, the next operation can be started at desired timing. That is, the second unit can efficiently and sequentially execute an expected plurality of operations without being influenced by the stopping and start of the power supply.

Moreover, the invention can be realized as a production system that executes the power supply control method according to any aspect described above.

Moreover, in the power supply control method according to the aspect of the invention, the second unit may have a plurality of subunits each partially in charge of the operation of the second unit, and in the stopping, the power supply to at least one of the plurality of subunits may be stopped and the power supply to at least another one of the subunits may not be stopped.

With this method, even when it has been determined to turn off the power supply for the operation of the second unit, for example, in accordance with property specific to each subunit (for example, a state greatly changes as a result of turning off the power supply), the power supply to part of the subunits is kept ON. As a result, for example, while suppressing the deterioration in the production efficiency, the power consumption reduction can be promoted.

Moreover, in the power supply control method according to the aspect of the invention, in the stopping, subunit information indicating whether or not it is permitted to stop the power supply to each of the plurality of subunits may be referenced, and the power supply to at least one of the subunits for which the subunit information indicates that it is permitted to stop the power supply may be stopped, and the power supply to at least another one of the subunits for which the subunit information indicates that it is not permitted to stop the power supply may not be stopped.

With this method, ON/OFF control of the power supply for each subunit is executed based on the subunit information. That is, ON/OFF of the power supply for each subunit is controlled easily and accurately. Moreover, updating the subunit information ensures accurate the ON/OFF control of the power supply for each subunit even in a case where there arises any change in the function, the capability, etc. of each subunits.

For example, according to another aspect of the invention, a production system including a first unit and a second unit that produce a component mounting board by repeatedly starting and stopping operation in a coordinated manner, includes: a power supply control section configured to start power supply for the operation of the second unit in accordance with a signal acquired according to an operation status of the first unit; an operation control section configured to cause the second unit to start the operation after the start of the power supply; an operation time management section configured to acquire stop time information indicating time from when the operation ends to when the next operation of the second unit starts; and a determination section configured to determine, based on the acquired stop time information, whether or not to stop the power supply after the started operation ends, wherein the power supply control section is configured to stop the power supply when the determination section determines to stop the power supply.

With this configuration, without deteriorating the production efficiency of the production system, the amount of power consumption reduction can be increased.

Moreover, the invention can be realized as a program for urging a computer to execute each processing included in the power supply control method according to one aspect of the invention and also as a recording medium in which this program is recorded. Then this program can be distributed via a transfer medium such as the Internet or a recording medium such as a DVD.

Advantageous Effects of Invention

According to the invention, for each of the plurality of units included in the production system that produces a component mounting board, based on the stop time information indicating the time from when operation stops to when the next operation starts, it can be determined whether or not to stop power supply for the operation of this unit.

Therefore, the invention can provide a power supply control method and a production system for increasing the amount of power consumption reduction without deteriorating the production efficiency of the production system.

DESCRIPTION OF EMBODIMENTS

Hereinafter, embodiments for carrying out the present invention will be described with reference to the accompanying drawings.

Embodiment 1

Figure 1:
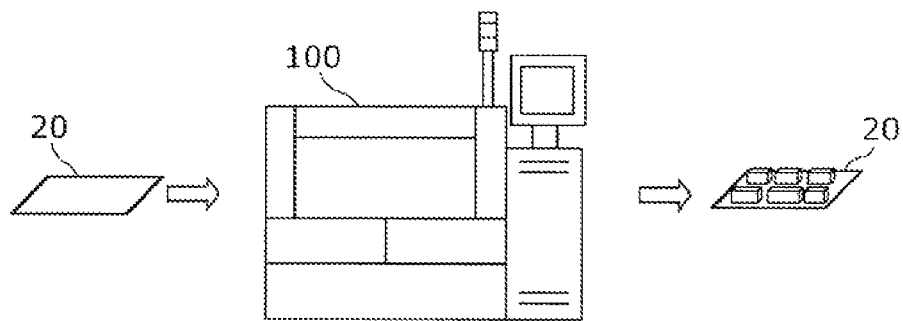
FIG. 1 is an outline diagram showing an outline of a component mounting machine according to Embodiment 1 of the present invention.

FIG. 1 is an outline diagram showing an outline of a component mounting machine 100 according to Embodiment 1 of the invention.

The component mounting machine 100 according to Embodiment 1 is a first example of a production system of the invention and a first example of a production system that executes a power control method according to the invention.

As shown in FIG. 1, the component mounting machine 100 according to Embodiment 1 is a machine which forms, for example, part of a production line for producing a component mounting board and which produces the component mounting board by mounting a plurality of components onto a board 20 carried in from a former process.

Figure 2:
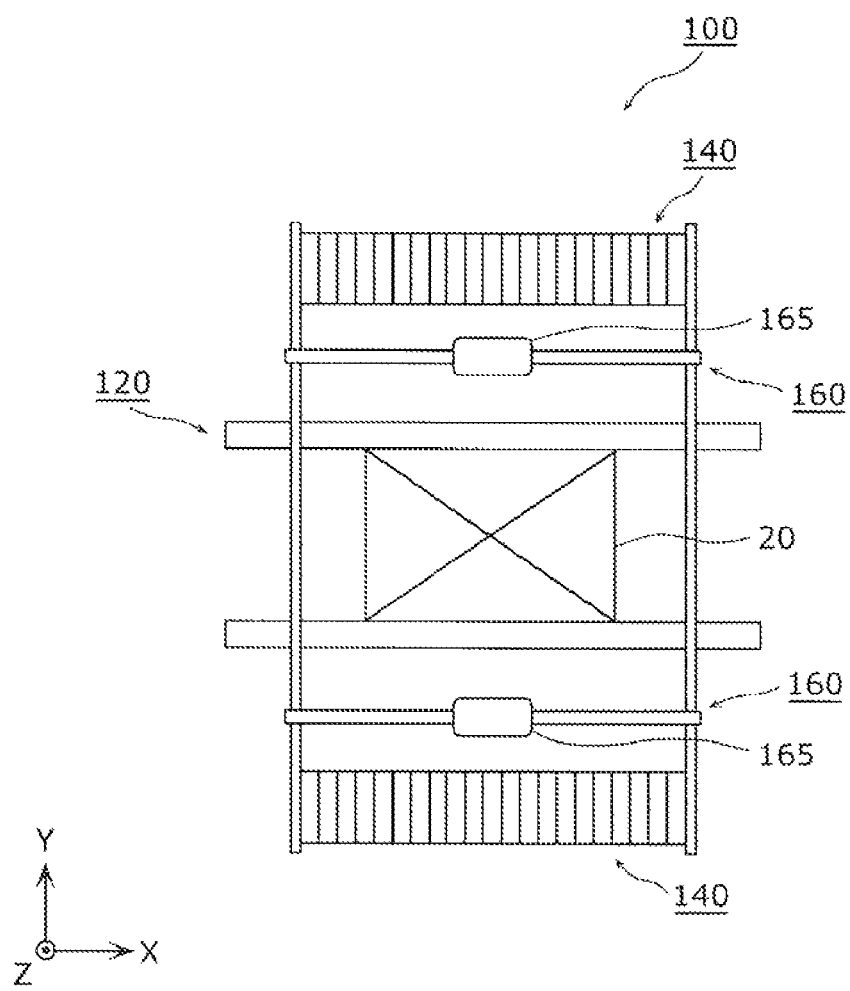
FIG. 2 is a plan view showing main configuration of inside of the component mounting machine according to Embodiment 1.

FIG. 2 is a plan view showing main configuration of inside of the component mounting machine 100 according to Embodiment 1.

The component mounting machine 100 includes: a conveyance unit 120 that conveys the board 20; a component supply unit 140 that supplies a component to be mounted onto the board 20; and a mounting unit 160 that mounts the component supplied from the component supply unit 140 onto the board 20 conveyed by the conveyance unit 120. The mounting unit 160 mounts the component onto the board 20 by a mounting head 165.

These conveyance unit 120, component supply unit 140, and mounting unit 160 produce the component mounting board by repeatedly starting and stopping operation in a coordinated manner. Moreover, the production of the component mounting board is executed under control of a main control unit included in the component mounting machine 100.

Any two of the conveyance unit 120, the component supply unit 140, and the mounting unit 160 are a first unit and a second unit, respectively, as one example in a power supply control method of the invention.

Figure 3:
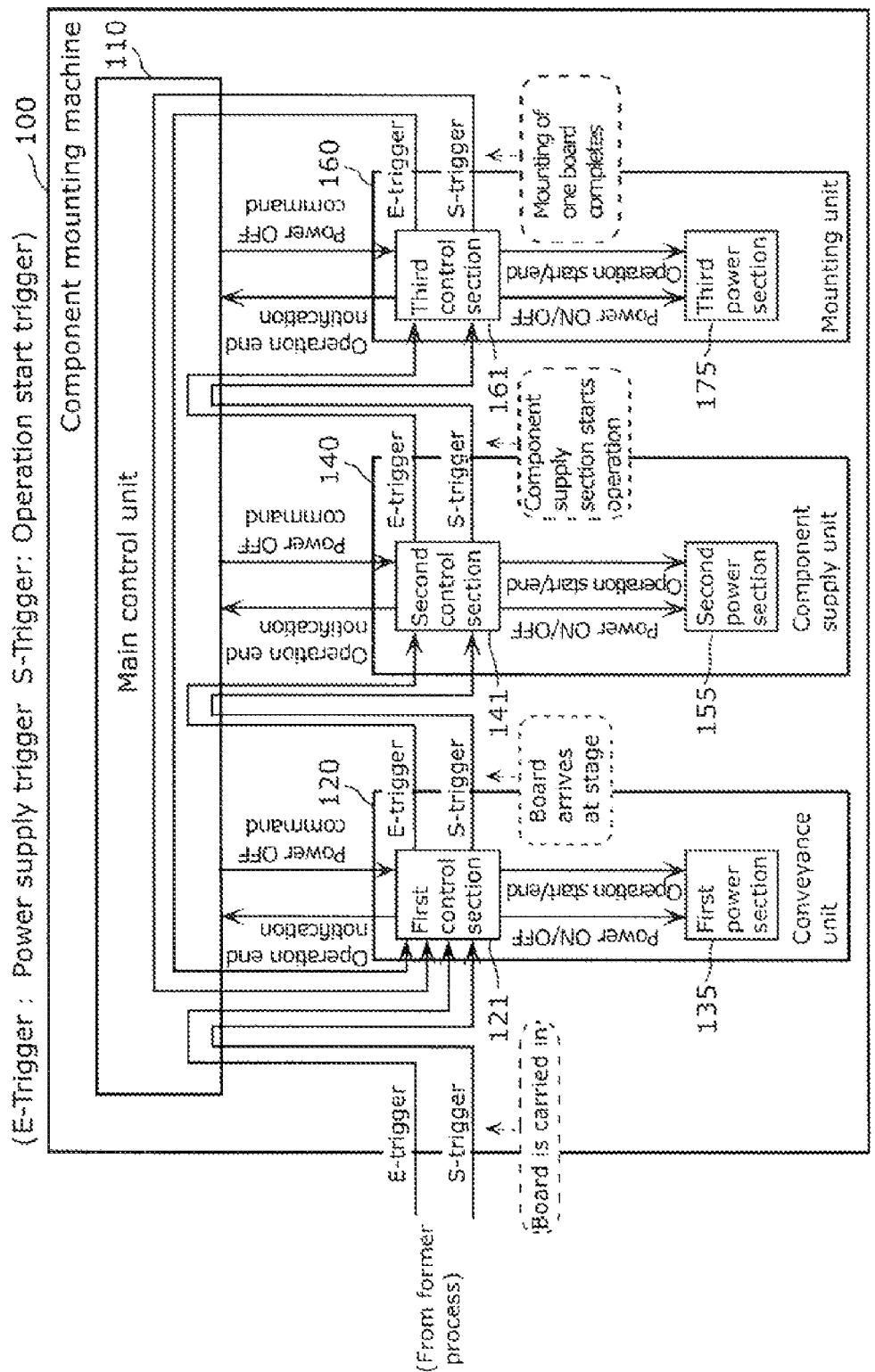
FIG. 3 is a block diagram showing a flow of a control signal in the component mounting machine according to Embodiment 1.

FIG. 3 is a block diagram showing a flow of a control signal in the component mounting machine 100 according to Embodiment 1.

The component mounting machine 100 includes the main control unit 110 that controls the operation of the conveyance unit 120, the component supply unit 140, and the mounting unit 160.

The conveyance unit 120 has: a first power section 135 including, for example, a conveyance rail that conveys a board; and a first control section 121 that controls operation of the first power section 135.

The component supply unit 140 has: a second power section 155 including a component supply section that sequentially delivers held components; and a second control section 141 that controls operation of the second power section 155.

The mounting unit 160 has: a third power section 175 including the mounting head 165, etc.; and a third control section 161 that controls operation of the third power section 175.

Moreover, as shown in FIG. 3, on the board conveyed from the former process, the conveyance unit 120, the component supply unit 140, and the mounting unit 160 perform predetermined operation in order just mentioned, and one cycle of work is completed.

Moreover, upon execution of this one cycle of work, in accordance with a signal obtained according to an operation status of the former unit in working processes, power supply for the operation of the latter unit in the working processes is started. More specifically, in this embodiment, from the former unit in the working processes, a power supply trigger and an operation start trigger destined to the latter unit in the working processes are transmitted.

Hereinafter, referring to FIG. 3, a basic flow of a control signal when the component mounting machine 100 produces a component mounting board will be described.

First, when the board is to be carried into the component mounting machine 100 from the former process, for example, the power supply trigger and the operation start trigger are transmitted to the component mounting machine 100 from the former process.

The main control unit 110, upon reception of these power supply trigger and operation start trigger, transmits the power supply trigger and the operation start trigger to the first control section 121 included in the conveyance unit 120.

Note that the component mounting machine 100 may detect that the board has been carried from the former process into the is component mounting machine 100. For example, the component mounting machine 100 includes a first sensor and a second sensor both of which detect the board, and when the first sensor has detected that the board was carried out from the former process, the main control unit 110 transmits the power supply trigger to the first control section 121. Further, when the second sensor has detected that the board arrived at a position which requires running of the conveyance unit 120, the main control unit 110 transmits the operation start trigger to the first control section 121.

Moreover, it may be assumed that the first control section 121 obtained the operation start trigger corresponding to the power supply trigger a predetermined period of time (time required for turning into an operable state after start of the power supply to the first power section 135) after timing at which the first sensor detected the board.

The first control section 121, in accordance with these triggers, starts the power supply to the first power section 135 and also provides instructions for starting the operation. Then upon arrival of the board at a stage (region where the board is stopped for component mounting), the power supply trigger and the operation start trigger destined to the component supply unit 140 are transmitted from the first control section 121 to the main control unit 110.

The main control unit 110, upon reception of these power supply trigger and operation start trigger, transmits the power supply trigger and the operation start trigger to the second control section 141 included in the component supply unit 140.

The second control section 141, in accordance with these triggers, starts the power supply to the second power section 155 and provides instructions for starting the operation. Then when the component supply section included in the second power section 155 has turned into an operable state, the power supply trigger and the operation start trigger destined to the mounting unit 160 are transmitted from the second control section 141 to the main control unit 110.

The main control unit 110, upon reception of these power supply trigger and operation start trigger, transmits the power supply trigger and the operation start trigger to the third control section 161 included in the mounting unit 160.

The third control section 161, in accordance with these triggers, starts the power supply to the third power section 175 and provides instructions for starting the operation. Then upon completion of the component mounting onto the board, the power supply trigger and the operation start trigger destined to the conveyance unit 120 are transmitted from the third control section 161 to the main control unit 110.

The main control unit 110, upon reception of these power supply trigger and operation start trigger, transmits the power supply trigger and the operation start trigger to the first control section 121 included in the conveyance unit 120.

The first control section 121, in accordance with these triggers, start the power supply to the first power section 135 and provides instructions for starting the operation. As a result, the board on which the component mounting has been completed is carried out.

Note that each of the control sections (121, 141, and 161) does not have to acquire the power supply trigger and the operation start trigger originating from the unit operating previously in the working processes as a transmission source. For example, each control unit may acquire the power supply trigger and the operation start trigger by detecting an operation status of the unit operating previously.

In other words, each control section, by detecting the operation status of the unit operating previously, may recognize timing of starting the power supply to the operation section of its own unit and timing of starting the operation.

That is, each control section, in accordance with a signal acquired according to the operation status of the unit operating previously, can start the power supply to the operation section of its own unit and provide instructions for starting the operation.

As described above, by repeating a series of basic processing performed by the main body frame 120 and the condenser 140, and the plate spring 160 in a coordinated manner, sequential component mounting is performed on a plurality of boards.

Here, in the component mounting machine 100 of this embodiment, each of the conveyance unit 120, the component supply unit 140, and the mounting unit 160 (hereinafter referred to as "each unit") transmits to the main control unit 110 operation end notification upon every end of the operation.

The main control unit 110, upon reception of the operation end notification from each unit, determines whether or not to stop the power supply for the operation of the unit as a transmission source of the operation end notification. That is, the main control unit 110 determines whether or not to turn off the power supply for this unit.

The main control unit 110, upon the determination to turn off this power supply, transmits a power supply OFF command to the control section of the unit.

The processing executed by the main control unit 110, the first control section 121, the second control section 141, and the third control section 161 is realized by, for example, reading a control program for each processing by a CPU (central processing unit) for the execution.

Figure 4:
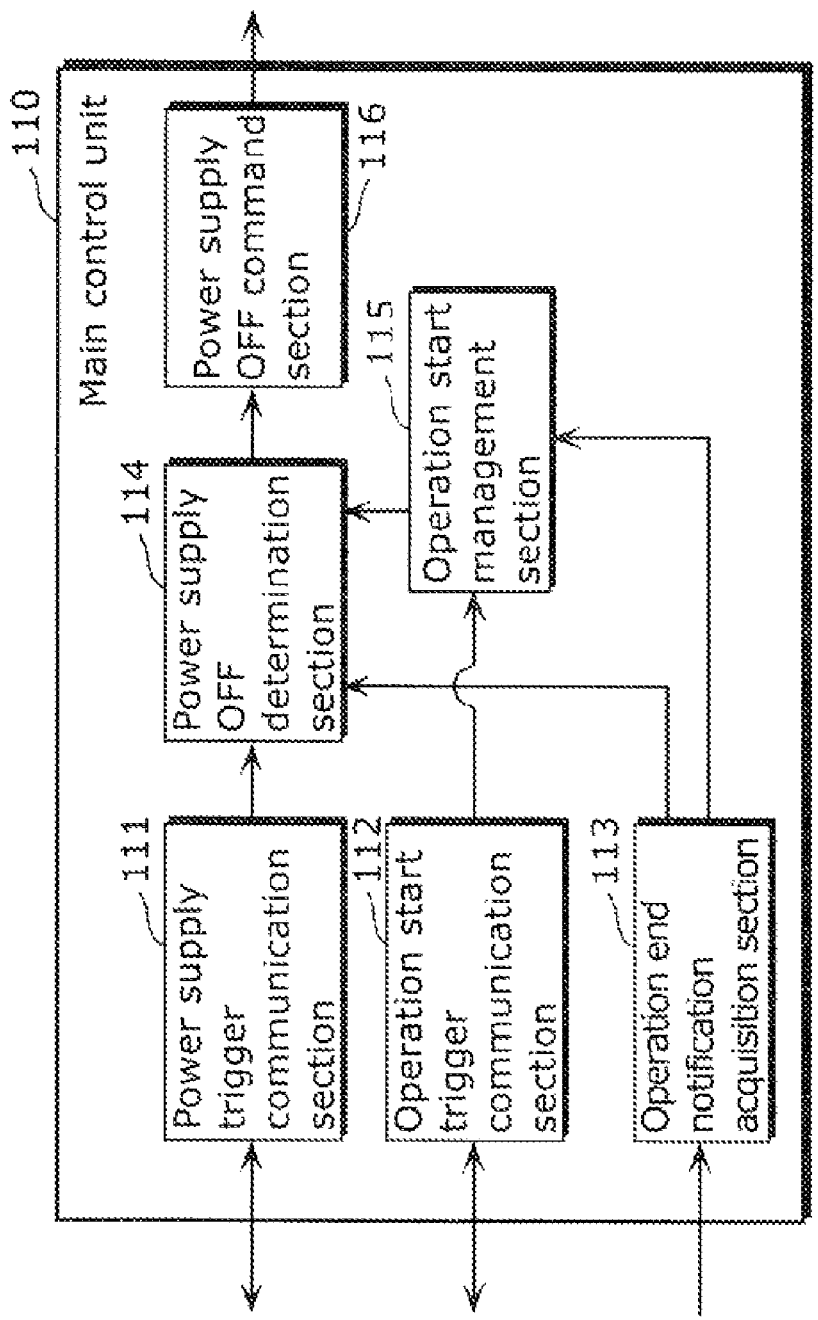
FIG. 4 is a block diagram showing main functional configuration of a main control unit according to Embodiment 1.

FIG. 4 is a block diagram showing main functional configuration of the main control unit 110 according to Embodiment 1.

As shown in FIG. 4, the component mounting machine 100 has: a power supply trigger communication section 111 that transmits and receives the power supply trigger; an operation start trigger communication section 112 that transmits and receives the operation start trigger; an operation end notification acquisition section 113 that acquires the operation end notification; a power supply OFF determination section 114 that determines whether or not to turn off the power supply for each unit; an operation time management section 115 that manages information used for the determination by the power supply OFF determination section 114; and a power supply OFF command section 116 that transmits the power supply OFF command to each unit.

The operation time management section 115, specifically, acquires and holds stop time information indicating time from when the operation performed by each unit ends to when the next operation starts. Moreover, the operation time management unit 115 acquires and holds, for each unit, time required for stopping the power supply and time required for turning into an operable state after the start of the power supply.

For example, operation time management section 115 acquires and holds, through, for example, past performance of the conveyance unit 120 or numerical calculation, the stop time information indicating the time from when the operation for carrying the board in by the conveyance unit 120 ends to when the operation for carrying the board out by the conveyance unit 120 starts and each of the required time described above.

For example, the main control unit 110 has the component mounting machine 100 perform several cycles of operation while continuing the power supply for each unit. Moreover, the main control unit 110 measures and accumulates the operation stop time for each unit during the several cycles of operation. Further, from the accumulated information, for example, a minimum value of the operation stop time for each unit is calculated as the stop time information for each unit. As a result, the stop time information for each unit can be acquired.

The stop time information may denote, for example, a numerical value such as "14 seconds" indicating time itself or a counter value indicating time such as "840" measured by a predetermined counter.

Moreover, the operation time management section 115 may make communication with an external device, for example, a computer, to thereby acquire the stop time information and information indicating time required for stopping and recovering the power.

Assumed here is a case where the operation end notification acquisition section 113 has acquired from, for example, the conveyance unit 120 the operation end notification following completion of the board carry-out. In this case, the power supply OFF determination section 114, based on the stop time information held by the operation time management section 115 and indicating stop time after the board carry-out, determines whether or not to turn off the power supply for the conveyance unit 120, that is, the power supply for driving the first power section 135. A detailed determination method will be described below.

For example, if the power supply OFF determination section 114 has determined to turn off the power supply for the conveyance unit 120, that is, the power supply for driving the first power section 135, the power supply OFF command section 116 transmits the power supply OFF command to the first control section 121.

The first control section 121, upon reception of the power supply OFF command, stops the power supply to the first power section 135. That is, the first control section 121 turns off the power supply.

The main control unit 110 performs for each unit such processing of determining whether or not to turn off the power supply (hereinafter referred to as "power supply OFF determination processing").

Moreover, when the power supply OFF command has been transmitted in accordance with a result of the power supply OFF determination processing, each unit turns off the power supply in accordance with this command.

Figure 5:
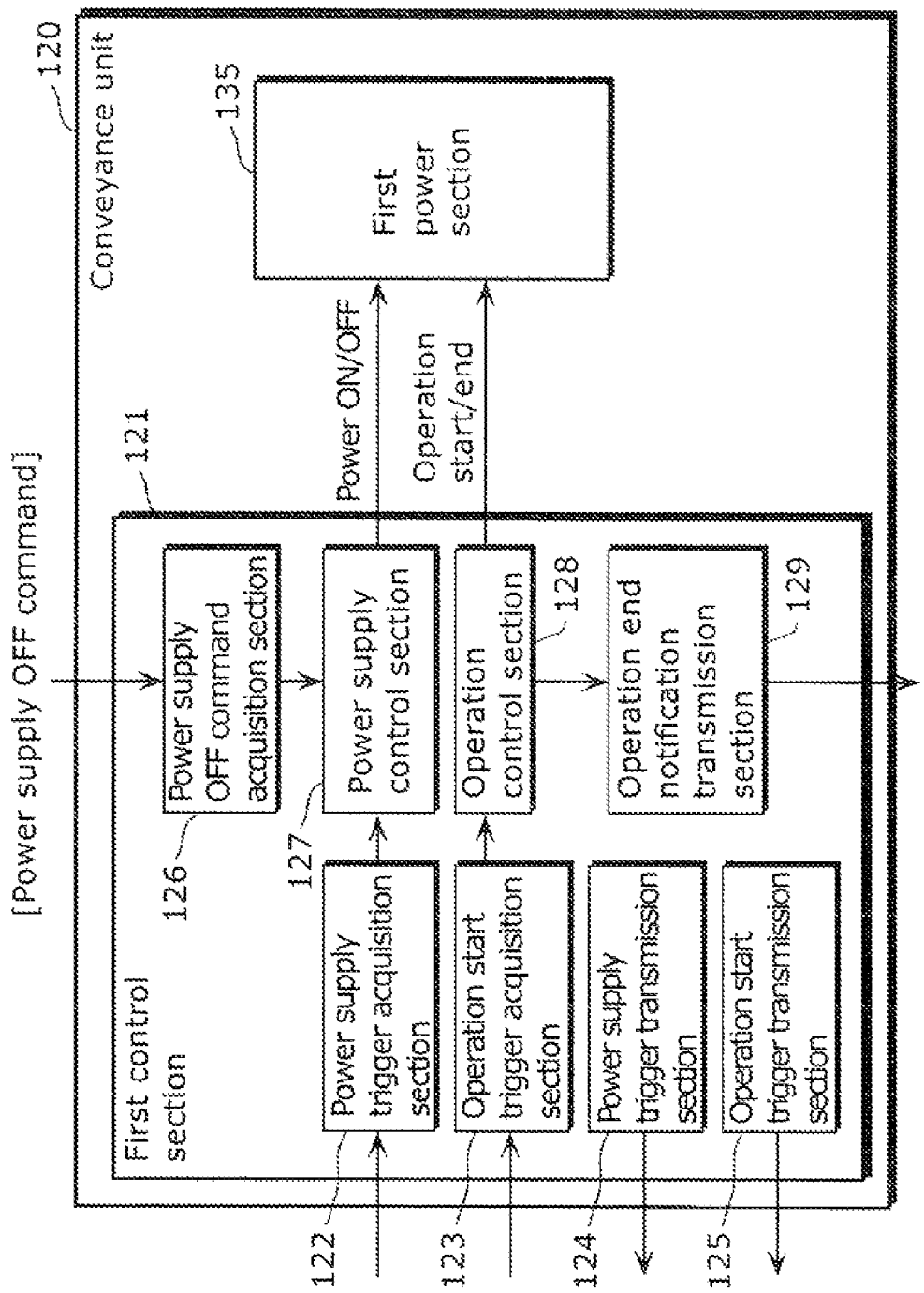
FIG. 5 is a block diagram showing main functional configuration of a conveyance unit according to Embodiment 1.

FIG. 5 is a block diagram showing main functional configuration of the conveyance unit 120 according to Embodiment 1.

Each of the component supply unit 140 and the mounting unit 160 has the same functional configuration for the power supply control as that of the conveyance unit 120, and operates under control of the main control unit 110. Thus, the functional configuration of the conveyance unit 120 as a representative of these three units will be described and the functional configuration of the other two units will be omitted from illustration and the description.

The first control section 121 of the conveyance unit 120 has: a power supply trigger acquisition section 122 that acquires the power supply trigger; an operation start trigger acquisition section 123 that acquires the operation start trigger; a power supply trigger transmission section 124 that transmits the power supply trigger; an operation start trigger transmission section 125 that transmits the operation start trigger; a power supply OFF command acquisition section 126 that acquires the power supply OFF command; a power supply control section 127 that controls the power supply to the first power section 135; an operation control section 128 that controls the operation of the first power section 135; and an operation end notification transmission section 129 that transmits the operation end notification.

The operation control section 128, upon completion of predetermined operation (for example, board carry-in) by the first power unit 135, notifies the operation end notification transmission section 129 that this operation has completed. The operation end notification transmission section 129, upon this notification, transmits the operation end notification to the main control unit 110.

In the main control unit 110, as described above, the power supply OFF determination processing for the conveyance unit 120 is performed. As a result, upon the transmission of the power supply OFF command from the main control unit 110, the power supply OFF command acquisition section 126 acquires this power supply OFF command.

The power supply OFF command acquisition section 126, upon the acquisition of the power supply OFF command, notifies this to the power supply control section 127. The power supply control section 127, upon reception of this notification, turns off the power supply to the first power section 135.

By the power supply trigger and the operation start trigger which are to be transmitted thereafter and which are destined to the conveyance unit 120, the next operation (for example, the board carry-out) by the first power section 135 is accurately executed.

A flow of operation of the component mounting machine 100 according to Embodiment 1 configured as described above will be described, referring to FIGS. 6 to 10.

Figure 6:
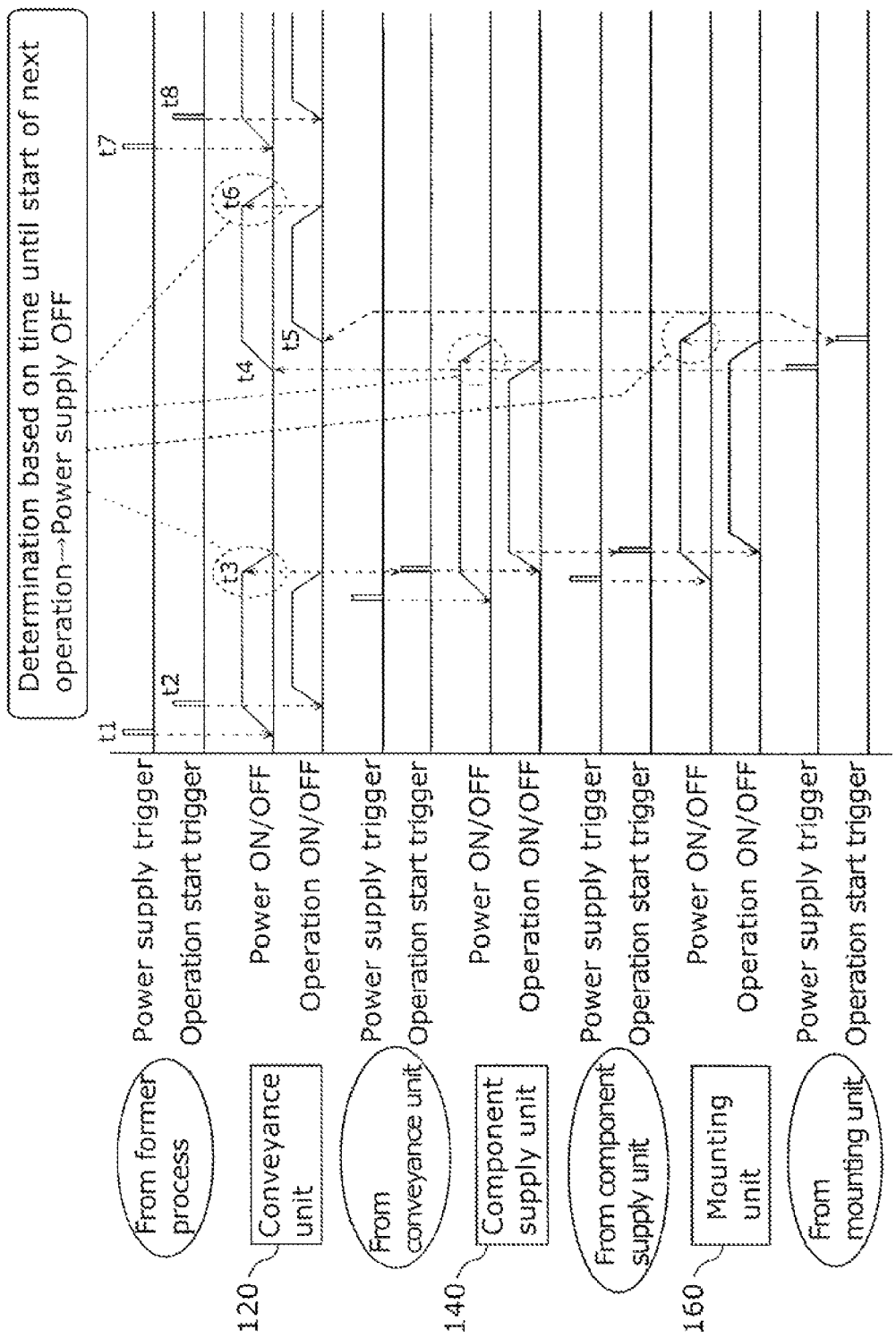
FIG. 6 shows one example of a timing chart showing power supply and operation ON/OFF timing of each unit of the component mounting machine according to Embodiment 1.

FIG. 6 shows one example of a timing chart showing ON/OFF timing of the power supply and the operation of each unit of the component mounting machine 100 according to Embodiment 1.

The power supply trigger and the operation start trigger destined to each unit are transmitted to each unit via the main control unit 110 as described above. However, in FIGS. 6 and 7 to be described below, for clarifying the timing chart, the main control unit 110 is omitted from illustration.

As shown in FIG. 6, upon the transmission of the power supply trigger from the former process (t1), in the conveyance unit 120, the power supply for driving the first power section 135 is turned on. Then as a result of passage of time (for example, one second) required for turning the conveyance unit 120 into an operable state after the start of the power supply, the first power section 135 turns into an operable state. Moreover, upon transmission of the operation start trigger from the former process (t2), the first power section 135 thereby starts, for example, the operation for the board carry-in.

As described above, the power supply is started at timing that is ahead of supposed timing of starting the operation by time corresponding to the time required for the conveyance unit 120 to turn into an operable state after the start of the power supply. As a result, the conveyance unit 120 can immediately start this operation at the supposed timing of starting this operation.

The start of the power supply may be at or before the timing that is ahead of the supposed timing of starting the operation by the time corresponding to the aforementioned required time (at or before the timing that is ahead by the time corresponding to the aforementioned required time). That is, if the power supply is in a stable state so that the conveyance unit 120 becomes operable by the supposed timing of starting the operation, there arises no wasteful waiting time for the conveyance unit 120.

The time required for the conveyance unit 120 to turn into an operable state after the start of the power supply is, in other words, time required for recovering the supplied power to the stable state at which the conveyance unit 120 is operable. Thus, the time required for the conveyance unit 120 to turn into an operable state after the start of the power supply is also expressed as "time required for the power recovery".

Upon completion of the operation for the board carry-in by the first power section 135, the operation completion notification is transmitted to the main control unit 110. The main control unit 110, based on the stop time information indicating time from the concerned operation of the conveyance unit 120 to the next operation, determines whether or not to turn off the power supply for the conveyance unit 120.

In this example, the main control unit 110 determines to turn off the power supply for the conveyance unit 120, and transmits the power supply OFF command to the conveyance unit 120. As a result, the power supply for driving the first power section 135 is turned off (t3).

Moreover, as shown in FIG. 6, each of the component supply unit 140 and the mounting unit 160 receives the power supply trigger and the operation start trigger via the main control unit 110 from the unit previously operating in the working processes.

Moreover, also in the component supply unit 140 and the mounting unit 160, the power supply is started at timing that is ahead of the supposed timing of starting the operation by time corresponding to the time required for the power recovery.

Moreover, in the example shown in FIG. 6, also for the component supply unit 140 and the mounting unit 160, the main control unit 110 determines to turn off the power supply, and the power supply to each of the them is turned off after completion of their operation.

The mounting unit 160 transmits the power supply trigger destined to the conveyance unit 120, and the conveyance unit 120 receives this power supply trigger. As a result, the conveyance unit 120 turns on the power supply to the first power section 135 (t4).

Moreover, the mounting unit 160 transmits the operation start trigger destined to the conveyance unit 120, and the conveyance unit 120 receives this operation start trigger. As a result, the conveyance unit 120 causes the first power section 135 to start the operation for the board carry-in (t5).

Then upon completion of this operation, the operation end notification indicating the completion of this operation is transmitted from the conveyance unit 120 to the main control unit 110. The main control unit 110, based on the stop time information indicating the time from the concerned operation of the conveyance unit 120 to the next operation, determines whether or not to turn off the power supply.

In this example, the main control unit 110 determines to turn off the power supply for the conveyance unit 120, and transmits the power supply OFF command to the conveyance unit 120. As a result, the power supply for driving the first power section 135 is turned off (t6).

Then the conveyance unit 120 receives the power supply trigger for the next operation (new board carry-in) to thereby start the power supply for driving the first power section 135 (t7). The conveyance unit 120 further receives the operation start trigger for starting the next operation to thereby start the next operation (t8).

As described above, in the component mounting machine 100 of this embodiment, upon completion of each operation of each unit, the power supply OFF determination processing is performed by the main control unit 110.

This processing is performed by, for example, comparing the time indicated by the stop time information for each unit and a predetermined threshold value.

In this embodiment, the power supply OFF determination unit 114 of the main control unit 110 determines to stop the power supply, if the time indicated by the stop time information for the given unit is longer than a sum of the time required for stopping the power supply and the time required for turning the unit into an operable state after the start of the power supply (the time required for the power recovery).

The time required for stopping the power supply, which time is used for the determination, does not necessarily have to be completely identical to actual required time (measured value or theoretical value). For example, time longer than the actual time required for stopping the power supply may be adopted as the time required for stopping the power supply which time is used for the determination.

This applies to the time required for the power recovery which time is used for the determination. Time longer than actual time required for the power recovery (experimental value or theoretical value) may be adopted as the time required for the power recovery which time is used for the determination.

Moreover, for example, the determination may be performed by making comparison between: a result of adding a predetermined value to a sum of the actual time required for stopping the power supply for the given unit and the actual time required for the power recovery; and the time indicated by the stop time information for this unit.

As described above, at least either of the time required for stopping the power supply and the time required for the power recovery, which are used for the power supply OFF determination processing, may be estimated to be longer.

This excludes, for example, a risk that the power supply to the given unit is turned off only for the reason that the time required for the power recovery after stop of the power supply of this unit is slightly longer than time obtained based on past performance, that is, a risk of deterioration in production efficiency by adoption of strict standards.

Figure 7:
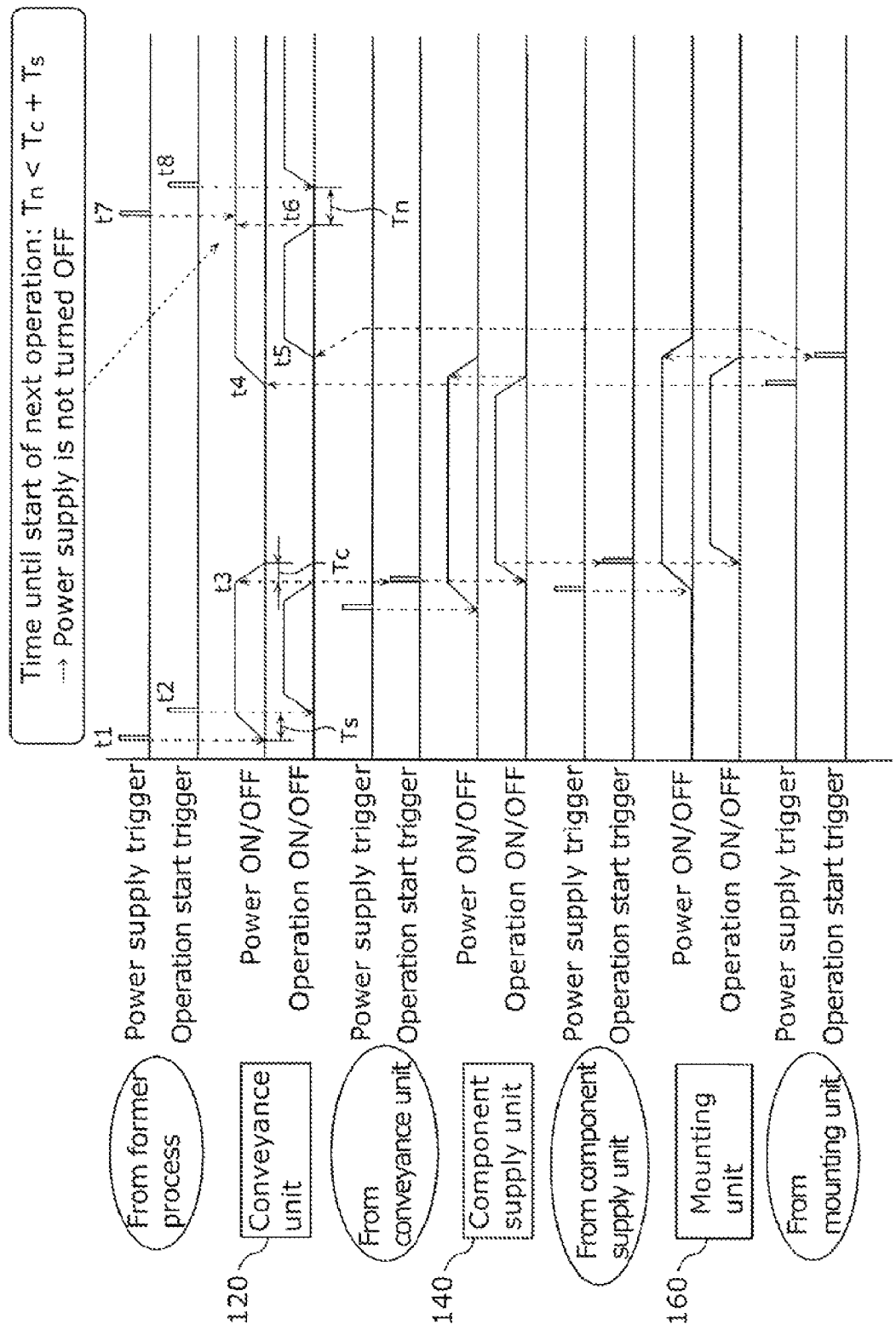
FIG. 7 shows another example of the timing chart showing the power supply and operation ON/OFF timing of each unit of the component mounting machine according to Embodiment 1.

FIG. 7 shows another example of the timing chart showing the power supply and operation ON/OFF timing of each unit of the component mounting machine 100 according to Embodiment 1.

As shown in FIG. 7, for example, for the conveyance unit 120, the time required for the power recovery is Ts and the time required for stopping the power supply is Tc.

Moreover, in an example shown in FIG. 7, time Tn (time from t6 to t8) during which the operation stops following end of the operation for the board carry-out (t6) is shorter than Tc+Ts. Therefore, the power supply OFF determination unit 114 determines not to turn off the power supply for the conveyance unit 120. That is, in the example shown in FIG. 7, since time from when the operation for the board carry-out ends to when operation for the next board carry-in starts is short, the power supply to the first power section 135 is kept ON.

Thus, turning off the power supply prevents occurrence of a problem of deteriorated production efficiency.

In the description of FIG. 4, the operation time management section 115 measures the operation stop time for each unit, and calculates a minimum value of the measured stop time as the stop time information for this unit. However, an average value or a maximum value of the operation stop time for each unit may be treated as the stop time information.

In this case, actual operation stop time is estimated to be longer by using the previously measured stop time, a chance that condition Tn>Tc+Ts is satisfied increases. That is, a chance that the power supply is stopped increases.

Specifically, it is possible to makes separate uses of the stop time information: the use of the stop time information set loner to prioritize the power consumption reduction; and the use of the stop time information set shorter to prioritize maintenance or improvement of the production efficiency.

Next, a flow of processing performed by the main control unit 110 will be described in detail, referring to FIGS. 8 and 9.

Figure 8:
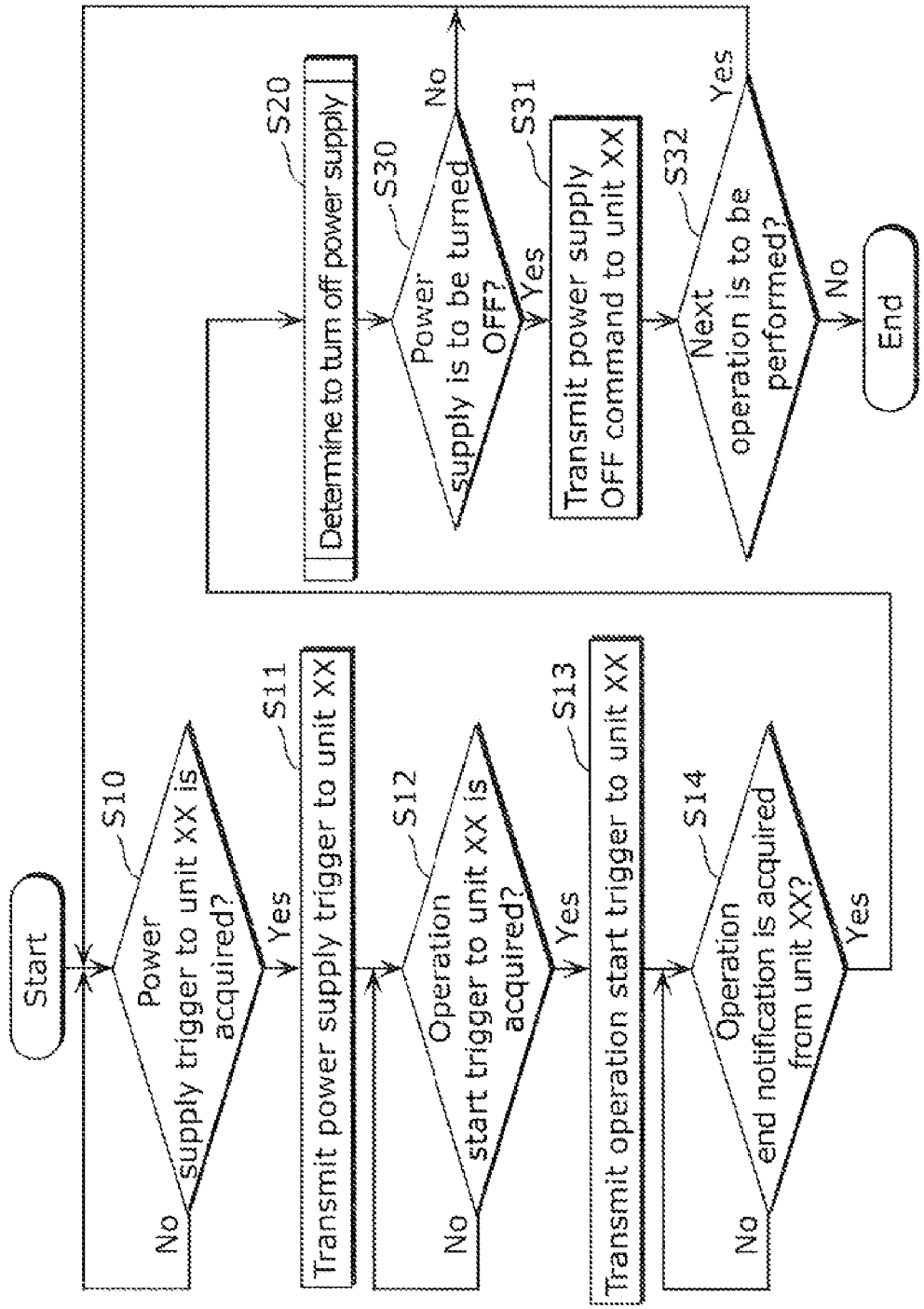
FIG. 8 is a flow diagram showing one example of a flow of processing of the main control unit according to Embodiment 1.

FIG. 8 is a flow diagram showing one example of the flow of the processing performed by the main control unit 110 according to Embodiment 1.

Figure 9:
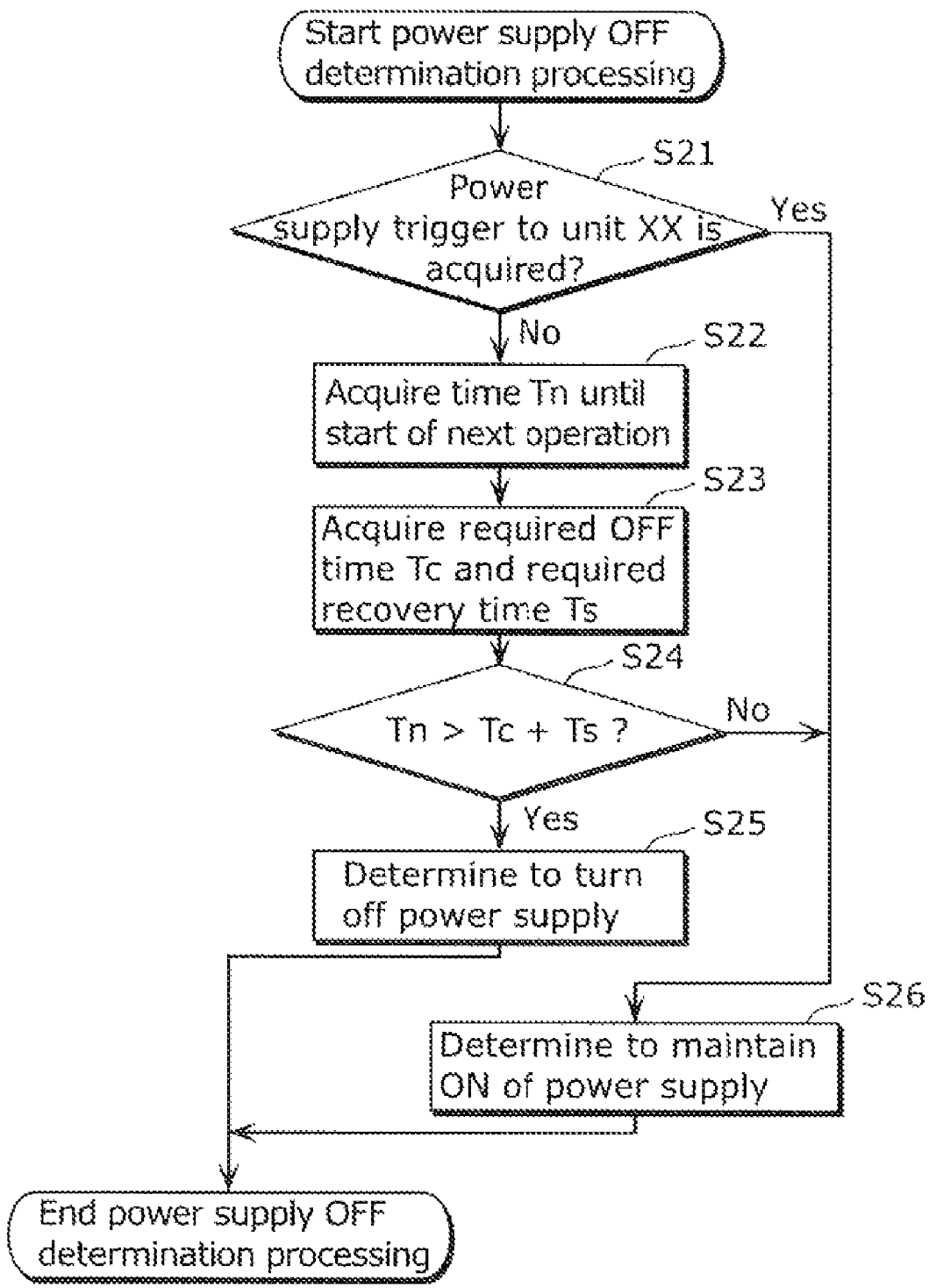
FIG. 9 is a flow diagram showing one example of a flow of power supply OFF determination processing according to Embodiment 1.

In FIGS. 8 and 9 and the description of these figures, "unit XX" corresponds to any of the conveyance unit 120, the component supply unit 140, and the mounting unit 160. That is, the main control unit 110 can perform the same processing to each of these units.

First, the power supply trigger communication section 111, upon acquisition of the power supply trigger destined to the unit XX, transmits the power supply trigger to the unit XX (S11).

Moreover, the operation start trigger communication section 112, upon acquisition of the operation start trigger destined to the unit XX (Yes in S12), transmits the operation start trigger to the unit XX (S13).

Then the operation end notification acquisition section 113, upon acquisition of the operation end notification from the unit XX (Yes in S14), performs the power supply OFF determination processing for the unit XX (S20).

When the power supply OFF determination section 114 has determined to turn off the power supply (Yes in S30), the power supply OFF command section 116 transmits the power supply OFF command to the unit XX (S31).

Then when the next operation is to be performed by the unit XX (Yes in S32), transition to checking on the acquisition of the power supply trigger destined to the unit XX (S10) occurs.

In the power supply OFF determination processing (S20), even if it has been determined not to turn off the power supply (No in S30), transition to the checking on the acquisition of the power supply trigger destined to the unit XX (S10) occurs.

Here, if it has been determined not to turn off the power supply (No in S30), the power supply for driving the power section of the unit XX is kept ON. Thus, in this case, the power supply trigger transmitted to the unit XX in S11 is ignored in the unit XX. Therefore, if it has been determined not to turn off the power supply (No in S30), the main control unit 110 may omit the processing of S10 and S11 and transit to checking on the acquisition of the operation start trigger destined to the unit XX (S12).

FIG. 9 is a flow diagram showing one example of a flow of the power supply OFF determination processing according to Embodiment 1.

The power supply OFF determination section 114, at a time point at which the power supply OFF determination processing starts, checks whether or not the next power supply trigger destined to the unit XX has been acquired (S21). That is, at this time point, if the next power supply trigger destined to the unit XX has been acquired, the power supply is to be kept ON without the determination. Therefore, if the next power supply trigger destined to the unit XX has been acquired at the time point at which the power supply OFF determination processing starts (Yes in S21), the power supply OFF determination section 114 determines to keep ON the power supply for the unit XX.

Moreover, if the next power supply trigger destined to the unit XX has not yet been acquired (No in S21), the power supply OFF determination section 114 acquires from the operation time management section 115 time Tn left until start of the next operation as the stop time information (S22). Moreover, the power supply OFF determination unit 114 acquires from the operation time management section 115 the time Ts required for the power recovery in the unit XX and the time Tc required for stopping the power supply (S23).

The power supply OFF determination section 114 further compares Tn and Tc+Ts. As a result, if Tn is larger than Tc+Ts (Yes in S24), the power supply OFF determination unit 114 determines to turn off the power supply (S25).

Moreover, if Tn is not larger than Tc+Ts (No in S24), the power supply OFF determination section 114 determines to keep the power supply ON (S26).

Note that, for the purpose of clearly describing the flow of the power supply OFF determination processing (corresponding to a series of processing shown in FIGS. 9 and S20 of FIG. 8) performed by the power supply OFF determination section 114, in FIG. 8, the power supply OFF determination processing (S20) is illustrated in a manner such as to start after checking on the acquisition of the operation end notification (Yes in S14).

However, if the transmission of the power supply OFF command (S31) is performed after the checking on the acquisition of the operation end notification (S14), the power supply OFF determination processing (S20) may be started before the checking on the acquisition of the operation end notification (Yes in S14).

Next, a flow of processing performed by the unit XX communicating with the main control unit 110 that performs the series of processing described above, that is, processing performed by each of the conveyance unit 120, the component supply unit 140, and the mounting unit 160 will be described in detail, referring to FIGS. 10 and 11.

Figure 10:
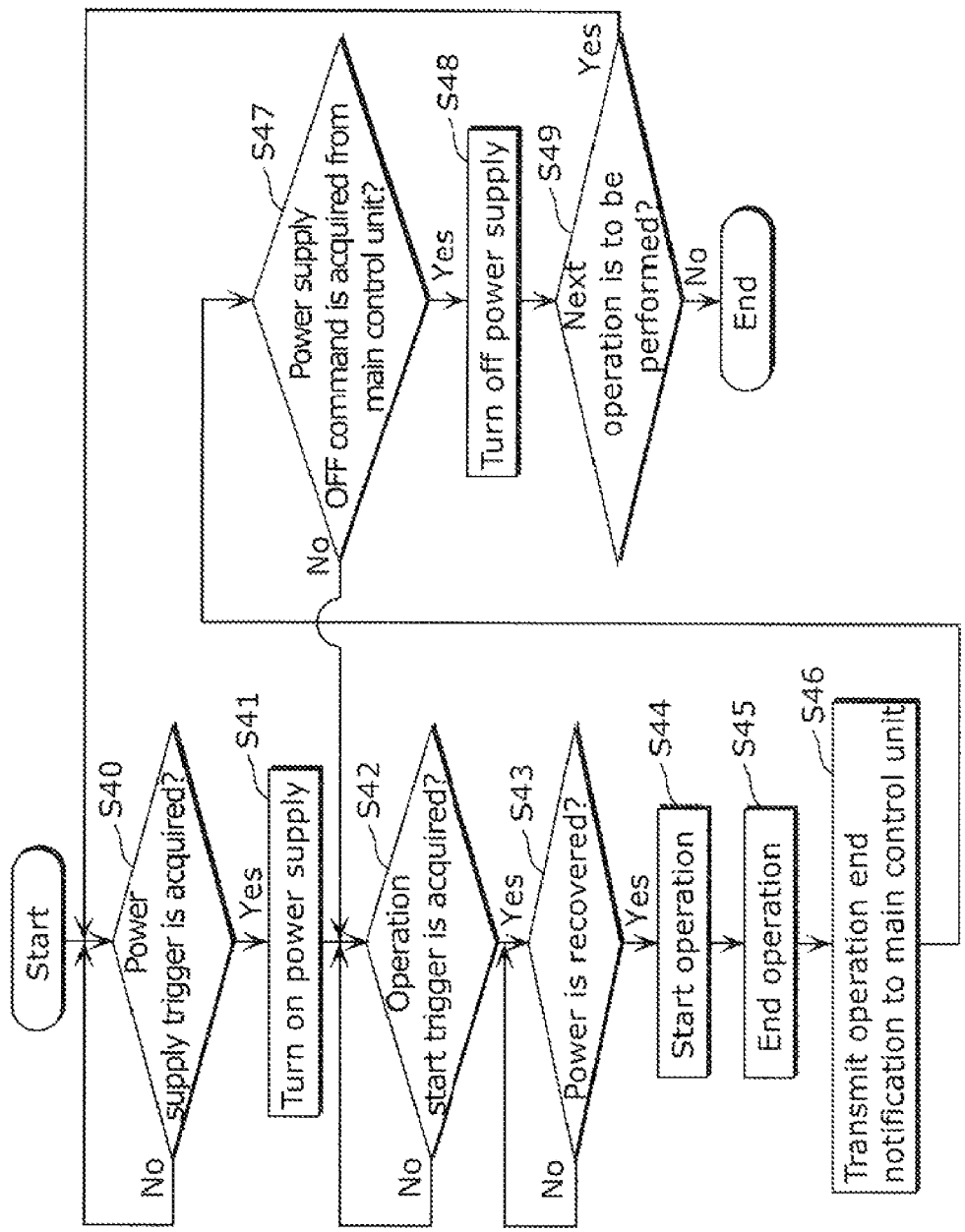
FIG. 10 is a flow diagram showing one example of processing performed by each unit according to Embodiment 1.

FIG. 10 is a flow diagram showing one example of a flow of the processing performed by each unit according to Embodiment 1. Referring to FIG. 10, one example of the flow of the processing of the conveyance unit 120 as the unit XX will be described. Note that each of the component supply unit 140 and the mounting unit 160 also performs the processing shown in FIGS. 10 and 11.

First, the power supply trigger acquisition section 122, upon acquisition of the power supply trigger destined to the conveyance unit 120 (Yes in S40), notifies this to the power supply control section 127. The power supply control section 127, upon reception of this notification, turns on the power supply to the first power section 135 (S41).

At this time point, if the power supply to the first power section 135 is kept ON, this processing (S41) is omitted.

Moreover, the operation start trigger acquisition section 123, upon acquisition of the operation start trigger destined to the conveyance unit 120 (Yes in S42), notifies this to the operation control section 128. The operation control section 128, upon reception of this notification, confirms whether or not the power has recovered to a stable state in which the first power section 135 is operable (S43).

If the power has recovered (Yes in S43), the operation control section 128 causes the first power unit 135 to start the operation (S44).

As described above, the power supply trigger destined to the conveyance unit 120 is transmitted so that the power supply starts ahead of supposed timing of starting the operation by the first power section 135 by the time corresponding to the time required for the power recovery. To this end, in principle, it is confirmed in the processing of S43 that the power has recovered to the stable state in which the first power section 135 is operable.

Moreover, for example, if the power consumption reduction is prioritized as described above, that is, if Tn is set at longer time, assumed is a case where time during which the first power section 135 actually stops is shorter than this Tn. In this case, it is assumed that at a time point at which the operation start trigger acquisition section 123 has acquired the operation start trigger, the power has not yet been completely recovered. However, even in such a case, the processing of checking the power recovery (S43) is performed, and thus completion of the power recovery (Yes in S43) is awaited and the operation of the first power section 135 is appropriately started.

Then upon end of the operation started in S44 (S45), the operation end notification transmission section 129 transmits to the main control unit 110 operation end notification indicating that the operation has ended (S46).

Then the power supply OFF determination processing shown in FIG. 9 is executed in the main control unit 110. As a result, the power supply OFF command acquisition section 126, upon acquisition of the power supply OFF command from the main control unit 110 (Yes in S47), notifies this to the power supply control section 127.

The power supply control section 127, upon reception of this notification, turns off the power supply to the first power section 135 (S48).

Then if the next operation (for example, new board carry-in) is to be performed by the conveyance unit 120 (Yes in S49), transition to checking on whether or not the power supply trigger destined to the conveyance unit 120 has been acquired (S40) occurs.

Specifically, even in a case where the power supply for driving the first power section 135 has been stopped by the power supply OFF command from the main control unit 110, the power supply is recovered by the power supply trigger for the next operation. As a result, the conveyance unit 120 can start this next operation at appropriate timing.

Figure 11:
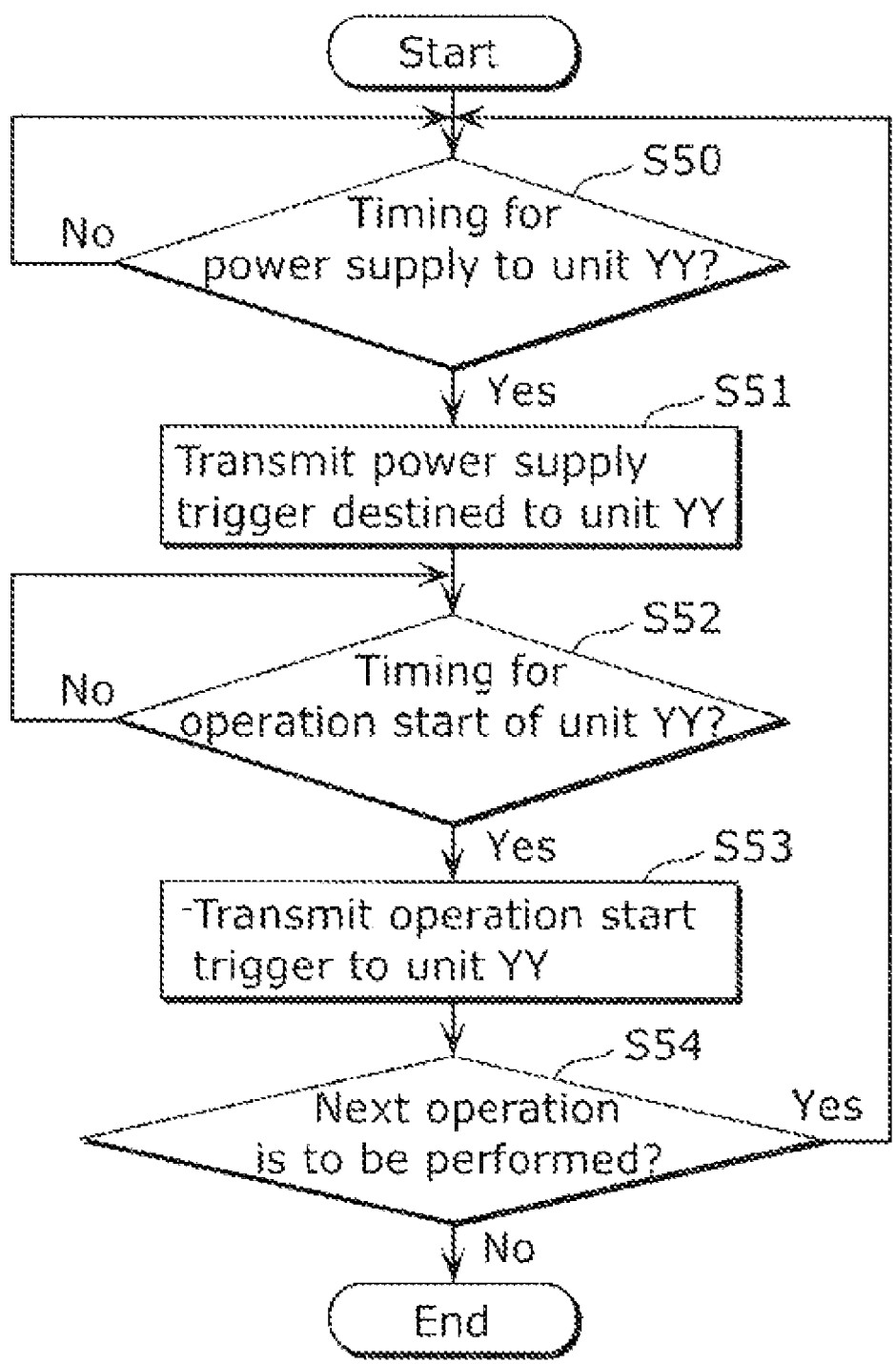
FIG. 11 is a flow diagram showing one example of a flow of processing performed when each unit transmits a signal for another unit according to Embodiment 1.

FIG. 11 is a flow diagram showing one example of a flow of processing performed when each unit transmits a signal for a different unit according to Embodiment 1.

A "unit YY" in FIG. 11 means the next unit in the working processes when viewed from the unit as a main part of the processing of FIG. 11. For example, it is the component supply unit 140 when viewed from the conveyance unit 120. Moreover, it is the conveyance unit 120 when viewed from the mounting unit 160.

Referring to FIG. 11, one example of the flow of the processing performed when the conveyance unit 120 transmits the signal to the component supply unit 140 as the unit YY.

The power supply trigger transmission section 124, if it is timing to start the power supply for the component supply unit 140 (Yes in S50), transmits to the main control unit 110 the power supply trigger destined to the component supply unit 140.

Moreover, the operation start trigger transmission section 125, if it is timing for the component supply unit 140 to start the operation (Yes in S52), transmits to the main control unit 110 the operation start trigger destined to the component supply unit 140.

Here, the supposed timing for the component supply unit 140 to start the operation is timing at which the board carried in by the conveyance unit 120 arrives at a stage or timing close thereto. Moreover, as described above, the power supply trigger destined to the component supply unit 140 is transmitted so that the power supply of the second power section 155 of the component supply unit 140 starts at timing that is ahead of the supposed timing of starting the operation by the component supply unit 140 by the time corresponding to the time required for the power recovery.

Note that procedures of transmitting the power supply trigger and the operation start trigger destined to the component supply unit 140 at the appropriate timing by the power supply trigger transmission section 124 and the operation start trigger transmission section 125 are not limited to any specific procedures.

For example, timing of transmitting the power supply trigger and the operation start trigger may be put into an operation sequence of the conveyance unit 120 defined by a control program executed by a CPU that realizes the processing performed by the first control section 121.

The conveyance unit 120, if the next operation is to be performed by the component supply unit 140 (for example, if the conveyance unit 120 has carried in a new board) (Yes in S54), transits to checking on whether or not it is timing to start the power supply for the component supply unit 140 (S50).

As described above, the component mounting machine 100 according to Embodiment 1, for each of the conveyance unit 120, the component supply unit 140, and the mounting unit 160 that produce a component mounting board by repeatedly starting and stopping the operation in a coordinated manner, determines whether or not to stop the power supply while the operation is stopped.

Moreover, time during which the operation of each unit is stopped is taken into consideration for this determination. Therefore, without deteriorating the production efficiency, power consumption of the component mounting machine 100 can be reduced.

Specifically, even in a case where the component mounting machine 100 continues normal operation, for any unit which is included in a plurality of units producing the component mounting board and which is stopped for a large proportion of time in one cycle of work, the power supply while the operation is stopped is turned off. Therefore, an amount of the power consumption reduction increases.

Moreover, even when the power supply has been stopped, each unit receives the power supply trigger for the next operation, and thus the power recovers and the next operation is accurately executed. More specifically, the power supply is started at timing that is ahead of the supposed timing of staring the next operation by the time corresponding to the time required for the power recovery. Thus, this next operation can be started immediately at the supposed timing of starting the next operation.

Embodiment 2

As Embodiment 2, a component mounting machine that determines whether or not each unit stops power supply for component mounting operation of its own unit will be described.

Figure 12:
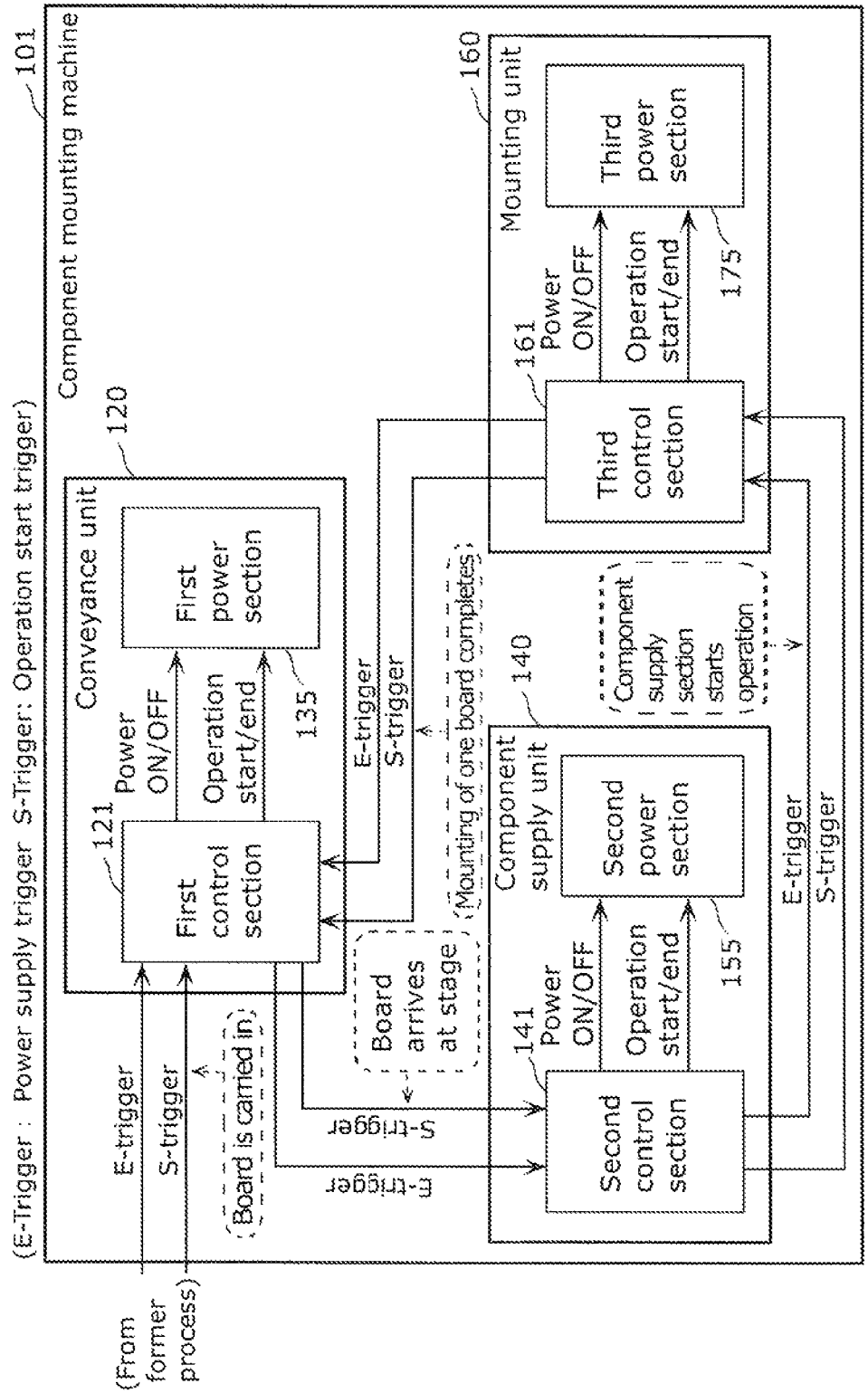
FIG. 12 is a block diagram showing a flow of a control signal in a component mounting machine according to Embodiment 2.

FIG. 12 is a block diagram showing a flow of a control signal in a component mounting machine 101 according to Embodiment 2.

The component mounting machine 101 according to Embodiment 2 is a second example of the production system of the invention and a second example of a production system that executes the power control method of the invention.

The component mounting machine 101 includes: a conveyance unit 120, a component supply unit 140, and a mounting unit 160.

Details of operation related to the component mounting of each unit according to Embodiment 2 are the same as those of each unit according to Embodiment 1.

Specifically, as shown in FIG. 12, on a board carried in from a former process, the conveyance unit 120, the component supply unit 140, and the mounting unit 160 perform predetermined operation in order just mentioned, and one cycle of work completes.

Moreover, upon execution of this one cycle of work, from the former unit in the working processes, a power supply trigger and a operation start trigger destined to the latter unit in the working processes are transmitted.

Here, as can be seen through comparison between FIGS. 12 and 3, in the component mounting machine 101 according to Embodiment 2, unlike in the component mounting machine 100 according to Embodiment 1, each unit does not receive the power supply OFF command from outside.

This is because control sections (121, 141, and 161) of the respective units have the function of determining whether or not to turn off power supply to power sections (135, 155, and 175) included in their own units.

Figure 13:
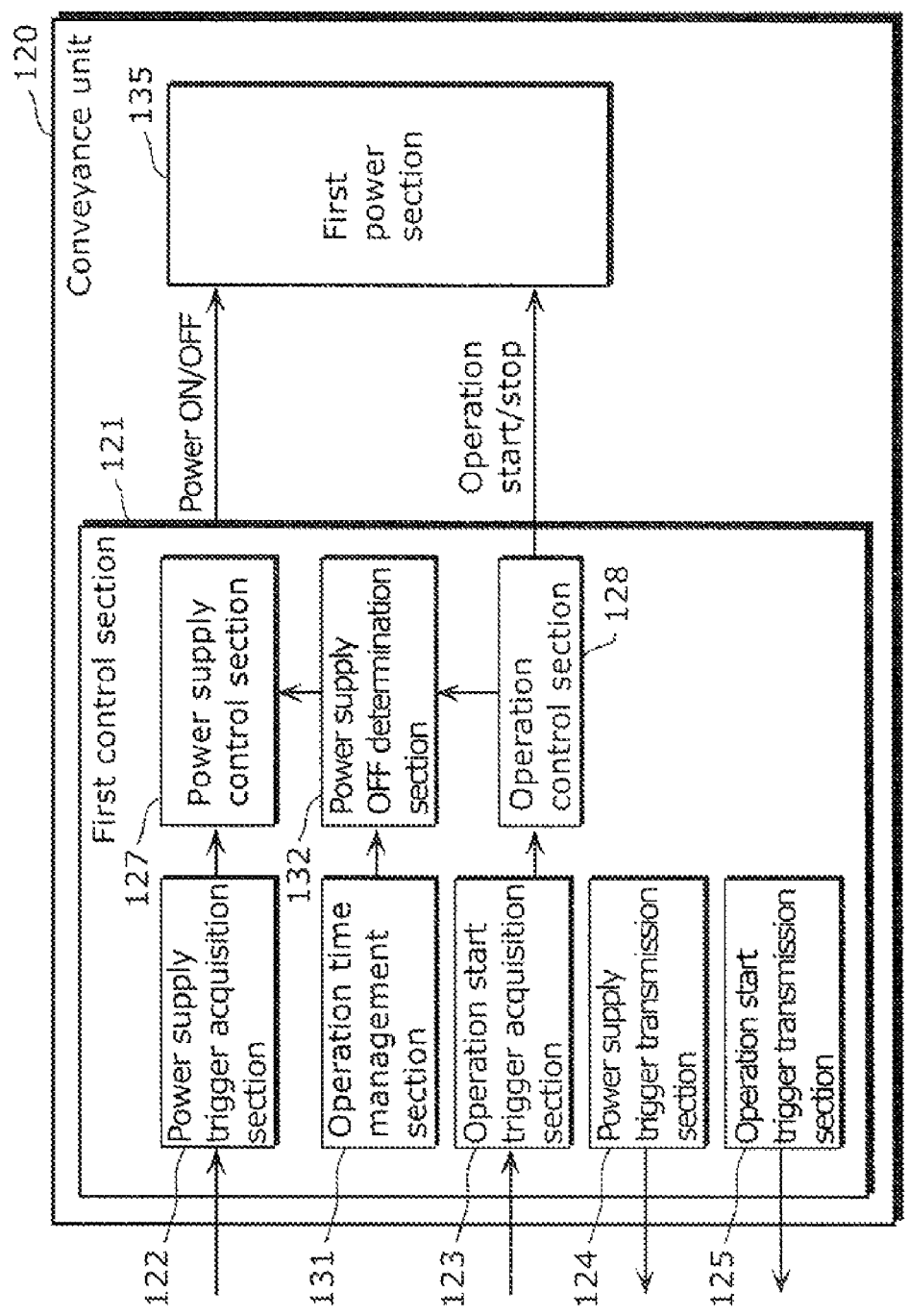
FIG. 13 is a block diagram showing main functional configuration of a conveyance unit according to Embodiment 2.

FIG. 13 is a block diagram showing main functional configuration of the conveyance unit 120 according to Embodiment 2.

Each of the component supply unit 140 and the mounting unit 160 according to Embodiment 2 has the same functional configuration as that of the conveyance unit 120 according to Embodiment 2, and can perform power supply OFF determination processing for its own unit. Thus, the functional configuration of the conveyance unit 120 as a representative of these three units will be described, and the functional configuration of the other two units will be omitted from illustration and the description.

As shown in FIG. 13, the configuration of the conveyance unit 120 according to Embodiment 2 is obtained from omitting the power supply OFF command acquisition section 126 and the operation end notification transmission section 129 from the functional configuration of the conveyance unit 120 according to Embodiment 1 and adding an operation time management section 131 and a power supply OFF determination section 132 to the aforementioned functional configuration.

The operation time management section 131 acquires and holds: stop time information indicating time from when operation performed by the conveyance unit 120 ends to when the next operation starts; time required for stopping power supply; and time required for power recovery.

The power supply OFF determination section 132, based on the stop time information held by the operation time management section 131, determines on the power supply for the conveyance unit 120, that is, whether or not to turn off the power supply for driving the first power section 135. A detailed determination method is the same as that of Embodiment 1.

Specifically, the power supply OFF determination section 132 compares a sum of time Tc required for stopping the power supply and time required for the power recovery (Tc+Ts) with operation stop time Tn indicated by the stop time information. As a result, if Tn is longer than Tc+Ts, the power supply OFF determination section 132 determines to turn off the power supply.

If the power supply OFF determination section 132 has determined to turn off the power supply, a power supply control section 127, in accordance with results of this determination, turns off the power supply to the first power section 135.

Then a power supply trigger acquisition section 122 receives a power supply trigger for the next operation transmitted from the former process or the mounting unit 160. As a result, the power supply control section 127 turns on the power supply to the first power section 135. Thus, the power recovers and the next operation is accurately executed.

Moreover, as is the case with Embodiment 1, the power supply trigger for the next operation is transmitted so that the power supply is started at timing that is ahead of the supposed timing of staring the next operation by the time corresponding to the time required for the power recovery. Thus, this next operation can be started immediately at the supposed timing of starting the next operation.

As described above, in the component mounting machine 101 according to Embodiment 2, each of the plurality of units that produces the component mounting board in a coordinated manner includes the power supply OFF determination section 132. As a result, each unit can turn off the power unit while the operation is stopped in a range not deteriorating the production efficiency. That is, even when the power supply has been turned off, the next operation can be started at the supposed timing of starting it.

Therefore, the component mounting machine 101 according to Embodiment 2, as is the case with the component mounting machine 100 according to Embodiment 1, can reduce the power consumption without deteriorating the production efficiency.

Note that each unit may not include the operation time management section 131. In this case, for example, the stop time information for each unit and information indicating time required for stopping and recovering the power may be acquired through communication with an external device such as a computer.

Embodiment 3

As Embodiment 3, a component mounting board production system including a plurality of component mounting machines will be described.

Figure 14:
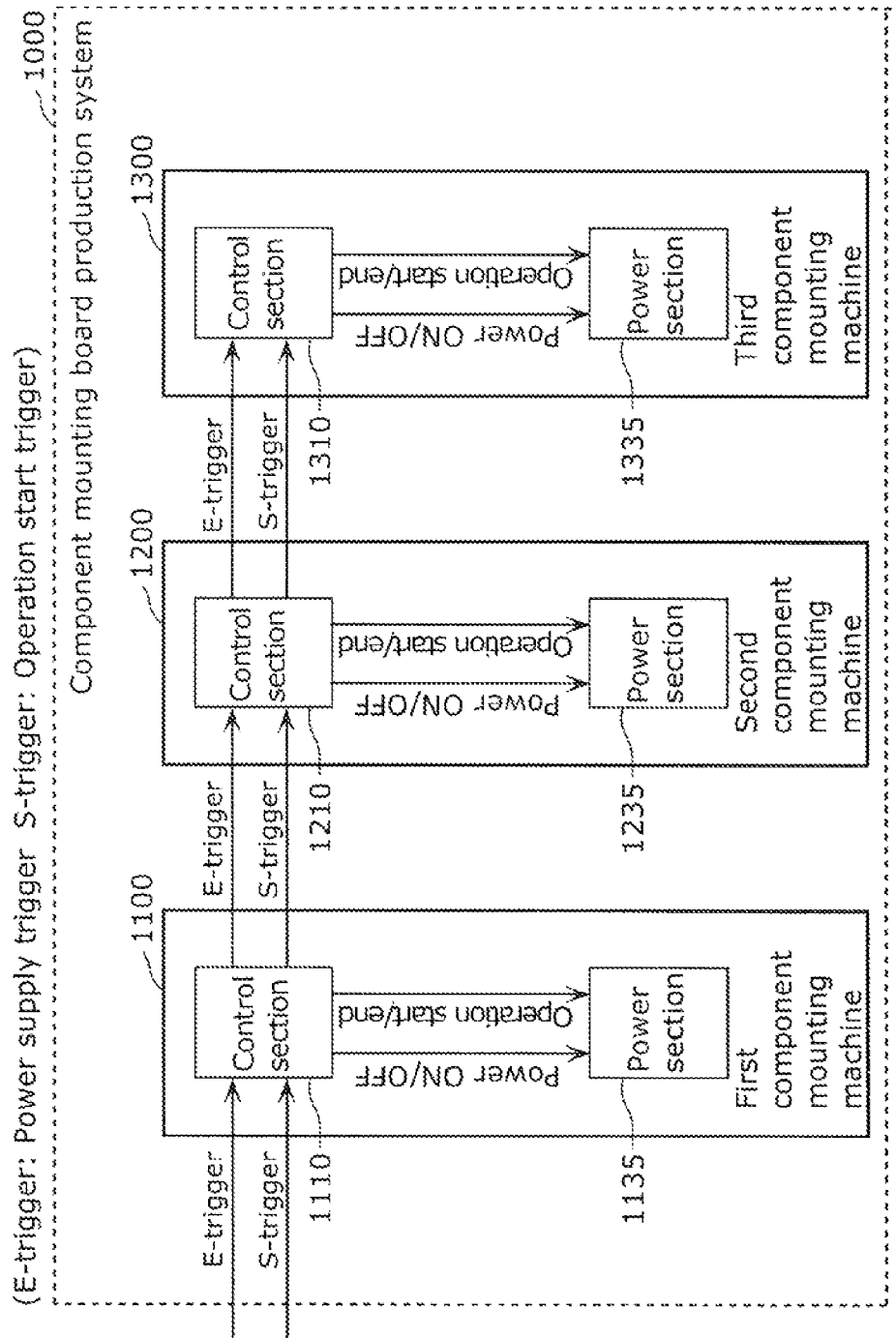
FIG. 14 is a block diagram showing a flow of a control signal in a component mounting board production system according to Embodiment 3.

FIG. 14 is a block diagram showing a flow of a control signal in the component mounting board production system 1000 according to Embodiment 3.

Note that the component mounting board production system 1000 according to Embodiment 3 is a third example of the production system of the invention and a third example of a production system that executes the power control method of the invention.

The component mounting board production system 1000 includes: a first component mounting machine 1100, a second component mounting machine 1200, and a third component mounting machine 1300 which produce a component mounting board by repeatedly staring and stopping operation in a coordinated manner.

Note that any two of these component mounting machines (1100, 1200, and 1300) are a first unit and a second unit as one example in the power supply control method of the invention. For example, in a case where the first component mounting machine 1100 is provided as the first unit, the second component mounting machine 1200 operates as the second unit.

In the component mounting board production system 1000, the first component mounting machine 1100, the second component mounting machine 1200, and the third component mounting machine 1300 perform component mounting operation on a board in order just mentioned. That is, through one cycle of work by these component mounting machines, the component mounting operation to be performed on the single board in the component mounting board production system 1000 completes.

As described above, the component mounting board production system 1000 is one kind of a production line for producing a component mounting board.

Each of the first component mounting machine 1100, the second component mounting machine 1200, and the third component mounting machine 1300 is hereinafter referred to as "each component mounting machine".

The first component mounting machine 1100 includes a control section 1110 and a power section 1135. The second component mounting machine 1200 includes a control section 1210 and a power section 1235. The third component mounting machine 1300 includes a control section 1310 and a power section 1335.

In each component mounting machine, the power section (1135, 1235, or 1335) has a mechanism for performing board conveyance, component supply, and component mounting onto the board under control of the control section (1110, 1210, or 1310).

Moreover, in the component mounting board production system 1000, as shown in FIG. 14, from an upstream side to a downstream side, a power supply trigger and an operation start trigger are sequentially transmitted.

Note that also in the component mounting board production system 1000, as described in Embodiment 1, the power supply trigger and the operation start trigger do not have to be actually transmitted from the upstream side to the downstream side. For example, each component mounting machine may acquire the power supply trigger and the operation start trigger by detecting a board carried into its own machine. Alternatively, for example, each component mounting machine may acquire the power supply trigger and the operation start trigger by detecting an operation status of, for example, the component mounting machine operating previously in the working processes. In either case, in accordance with a signal acquired according to the operation status of the component mounting machine operating previously, each component mounting machine can start power supply to its own power section and provides instructions for starting operation at appropriate timing.

For example, in the first component mounting machine 1100, the control section 1110, for example, upon reception of the power supply trigger transmitted from the former process, turns on the power supply to the power section 1135. Moreover, upon reception of the operation start trigger transmitted thereafter, the control section 1110 starts the operation for component mounting on one board by the power section 1135.

Then upon completion of this operation by the power section 1135, the board is carried out and the power supply trigger and the operation start trigger are transmitted to the second component mounting machine 1200 located downstream.

Moreover, as is the case with Embodiments 1 and 2, the power supply trigger destined to the second component mounting machine 1200 is transmitted so that the power supply for component mounting in the second component mounting machine 1200 is started at timing that is ahead of the supposed timing of starting the operation by the second component mounting machine 1200 by time corresponding to time required for power recovery.

Moreover, as is the case with the first component mounting machine 1100, the second component mounting machine 1200 also transmits the power supply trigger and the operation start trigger to the third component mounting machine 1300.

Moreover, the control section (1110, 1210, or 1310) of each component mounting machine, as is the case with the control section (121, 141, or 161) of each units, have the function of determining whether or not to turn off power supply for the component mounting operation by its own machine, that is, the function of executing power supply OFF determination processing for its own machine.

Figure 15:
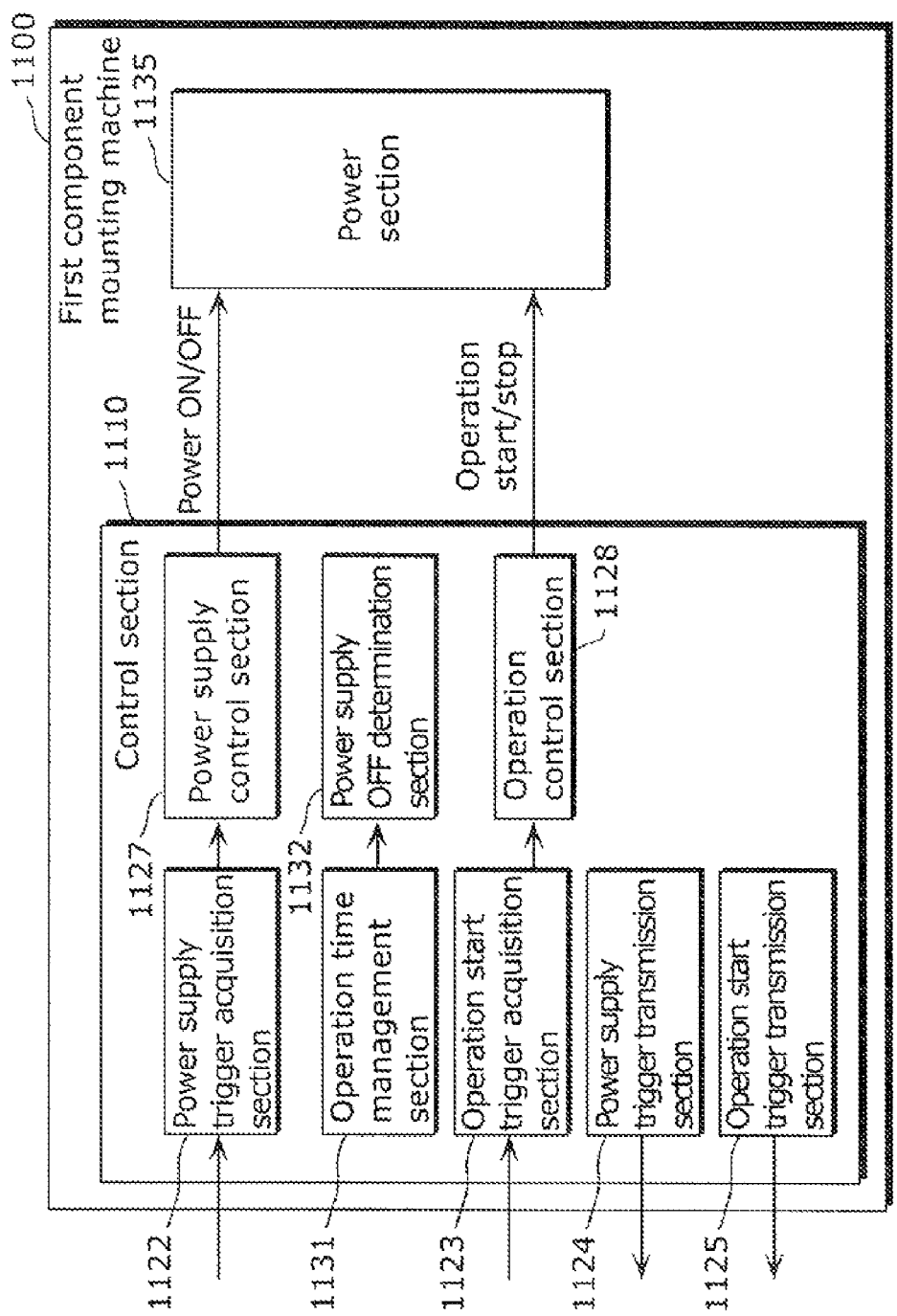
FIG. 15 is a block diagram showing main functional configuration of a first component mounting machine according to Embodiment 3.

FIG. 15 is a block diagram showing main functional configuration of the first component mounting machine 1100 according to Embodiment 3.

Each of the second component mounting machine 1200 and the third component mounting machine 1300 has the same functional configuration as that of the first component mounting machine 1100 and can perform the power supply OFF determination processing for its own machine. Thus, the functional configuration of the first component mounting machine 1100 according to Embodiment 3 as a representative of these three component mounting machines will be described, and the functional configuration of the other two component mounting machines will be omitted from illustration and the description.

As shown in FIG. 15, the first component mounting machine 1100 has: a power supply trigger acquisition section 1122, an operation start trigger acquisition section 1123, a power supply trigger transmission section 1124, an operation start trigger transmission section 1125, a power supply control section 1127, an operation control section 1128, an operation time management section 1131, and a power supply OFF determination section 1132.

The operation time management section 1131 acquires and holds: stop time information indicating time from when operation performed by the main control unit 110 ends to when the next operation starts; and time required for stopping and recovering power. For example, held as the stop time information is information indicating time from when one board is carried out to when the next board is carried in.

The stop time information and the time required for stopping and recovering the power, as is the case with Embodiment 1, are acquired and held through, for example, past performance of the first component mounting machine 1100 or numerical calculation.

The power supply OFF determination section 132, based on the stop time information held by the operation time management section 1131, determines whether or not to turn off power supply for the first component mounting machine 1100, that is, power supply for driving the power section 1135. A detailed determination method is the same as those of Embodiments 1 and 2.

Specifically, the power supply OFF determination section 132 compares a sum (Tc+Ts) of time Tc required for stopping power supply and time Ts required for power recovery with operation stop time Tn indicated by the stop time information. As a result, if Tn is longer than Tc+Ts, the power supply OFF determination section 1132 determines to turn off the power supply.

Specifically, in the first component mounting machine 1100 according to Embodiment 3, as is the case with each unit according to Embodiment 2, each of a plurality of units (a plurality of component mounting machines in this embodiment) that produce a mounting board in a coordinated manner includes the power supply OFF determination section 1132. As a result, each component mounting machine can turn off the power supply while the operation is stopped in a range not deteriorating the production efficiency.

For example, if processing capability of the first component mounting machine 1100 is low or the amount of work to be processed in the first component mounting machine 1100 is large, there may arise relatively long waiting time in the second component mounting machine 1200 from when a given board is carried out to when the next board is carried in.

In such a case, the second component mounting machine 1200, by comparing this waiting time with the time required for stopping and recovering the power, can turn off power supply for driving the power section 1235 in a range not deteriorating the production efficiency.

That is, the second component mounting machine 1200, even when the power supply has been turned off, can start operation to be performed on the next board at supposed timing of starting it.

Therefore, the component mounting board production system 1000 according to Embodiment 3, as is the case with the component mounting machine 100 and the component mounting machine 101 according to Embodiments 1 and 2, can reduce the power consumption without deteriorating the production efficiency.

Supplementary Description of Embodiments 1 to 3

In Embodiments 1 to 3, for the given unit or the given component mounting machine, if it has been determined to turn off the power supply, the power supply to the entire power section of this unit or this component mounting machine is turned off.

However, the power supply to only part of the power section of this unit or this component mounting machine may be turned off. That is, even if it has been determined to turn off the power supply, the power supply to a component partially in charge of operation to be performed by this unit or this component mounting machine may be kept ON.

Hereinafter, referring to the mounting unit 160 according to Embodiment 1 as an example, a description will be given on processing of keeping ON the power supply to the component partially in charge of the operation of the mounting unit 160 when it has been determined to turn off the power supply for the operation of the mounting unit 160.

Figure 16:
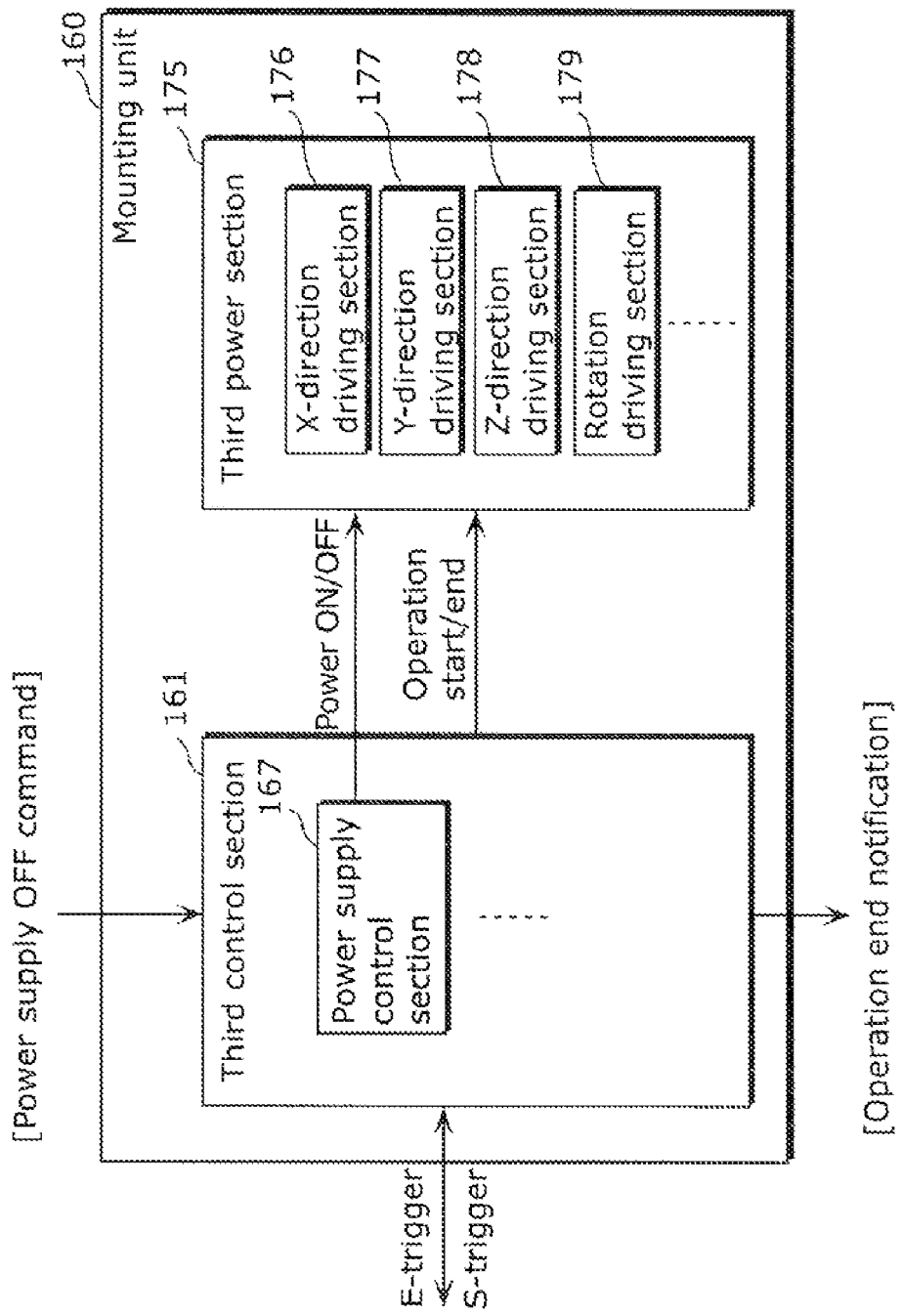
FIG. 16 is a block diagram showing one example of functional configuration of a mounting unit in supplementary description of Embodiments 1 to 3.

FIG. 16 is a block diagram showing one example of functional configuration of the mounting unit 160 in the supplementary description of Embodiments 1 to 3.

As shown in FIG. 16, the mounting unit 160 includes a third control section 161 and a third power section 175, which has: an X-direction driving section 176, a Y-direction driving section 177, a Z-direction driving section 178, and a rotation driving section 179. The third control section 161 also has a power supply control section 167.

The X-direction driving section 176, the Y-direction driving section 177, and the Z-direction driving section 178 are specifically motors or the like that drive movement in an X-axis direction, a Y-axis direction, and a Z-axis direction (direction perpendicular to a XY plane, see FIG. 2) of the mounting head 165.

Moreover, the rotation driving section 179 is specifically a motor or the like that drives rotation of the mounting head 165 around the Z-axis.

Each of the X-direction driving section 176 to the rotation driving section 179 is a unit partially in charge of operation for the entire mounting unit 160, and is hereinafter referred to as subunit.

Note that the subunit included in the mounting unit 160 is not limited to this, and thus may be, for example, a motor or the like that drives vertical movement of a nozzle included in the mounting head 165.

Moreover, the third control section 161, as is the case with the first control section 121 of the conveyance unit 120 shown in FIG. 5, also has other functional configuration of, for example, the power supply trigger acquisition section, but it is omitted in FIG. 16.

The mounting unit 160 having such configuration, for example, upon reception of a power supply OFF command from the main control unit 110, does not turn off the power supply for part of the subunits and thus keeps the power supply ON.

Such ON/OFF control of the power supply for each subunit is performed based on, for example, subunit information indicating whether or not to stop the power supply to each of the plurality of subunits. As a result, for example, ON/OFF of the power supply for each subunit is controlled easily and accurately.

Figure 17:
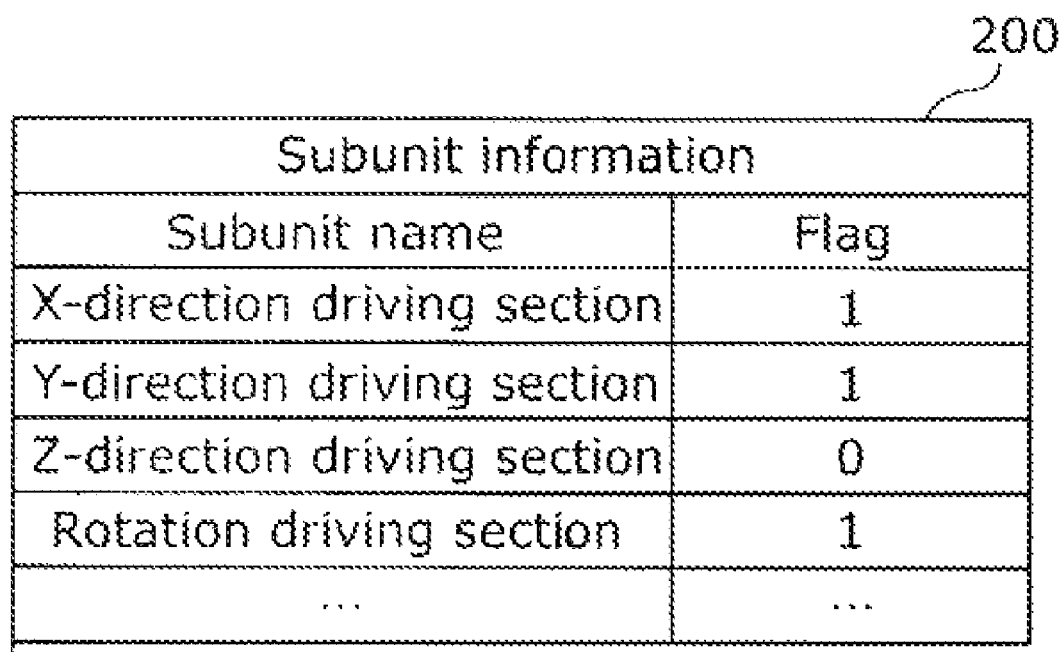
FIG. 17 is a diagram showing one example of data configuration of subunit information referenced in the mounting unit shown in FIG. 16.

FIG. 17 is a diagram showing one example of data configuration of the subunit information referenced in the mounting unit 160 shown in FIG. 16.

As shown in FIG. 17, the subunit information 200 includes, for each subunit, a flag indicating whether or not to stop the power supply. More specifically, for the subunit for which the flag is "1", it is permitted to stop the power supply, and for the subunit for which the flag is "0", it is not permitted to stop the power supply.

For example, for the Z-direction driving section 178, the subunit information 200 indicates that it is not permitted to stop the power supply.

An example of factors contributing no permit to stop the power supply to the Z-direction driving section 178 is given below. Specifically, as a result of stopping the power supply to the Z-direction driving section 178, for example, the mounting head 165 cannot maintain a height position at a time point at which the power supply has been stopped (for example, falls due to its own weight) and thus ingnorably shifts from the height position In this case, as a result of stopping the power supply to the Z-direction driving section 178, for example, quick start of normal operation upon restart of the power supply cannot be ensured.

Thus, the power supply control section 167 of the third control section 161, in accordance with such property specific to the subunit, turns off the power supply for only part of the subunits, and keeps ON the power supply for another part of the subunits.

The subunit information 200 may be previously stored into a predetermined storage region of the mounting unit 160, or the mounting unit 160 may receive it from a different device at timing in accordance with necessity.

Figure 18:
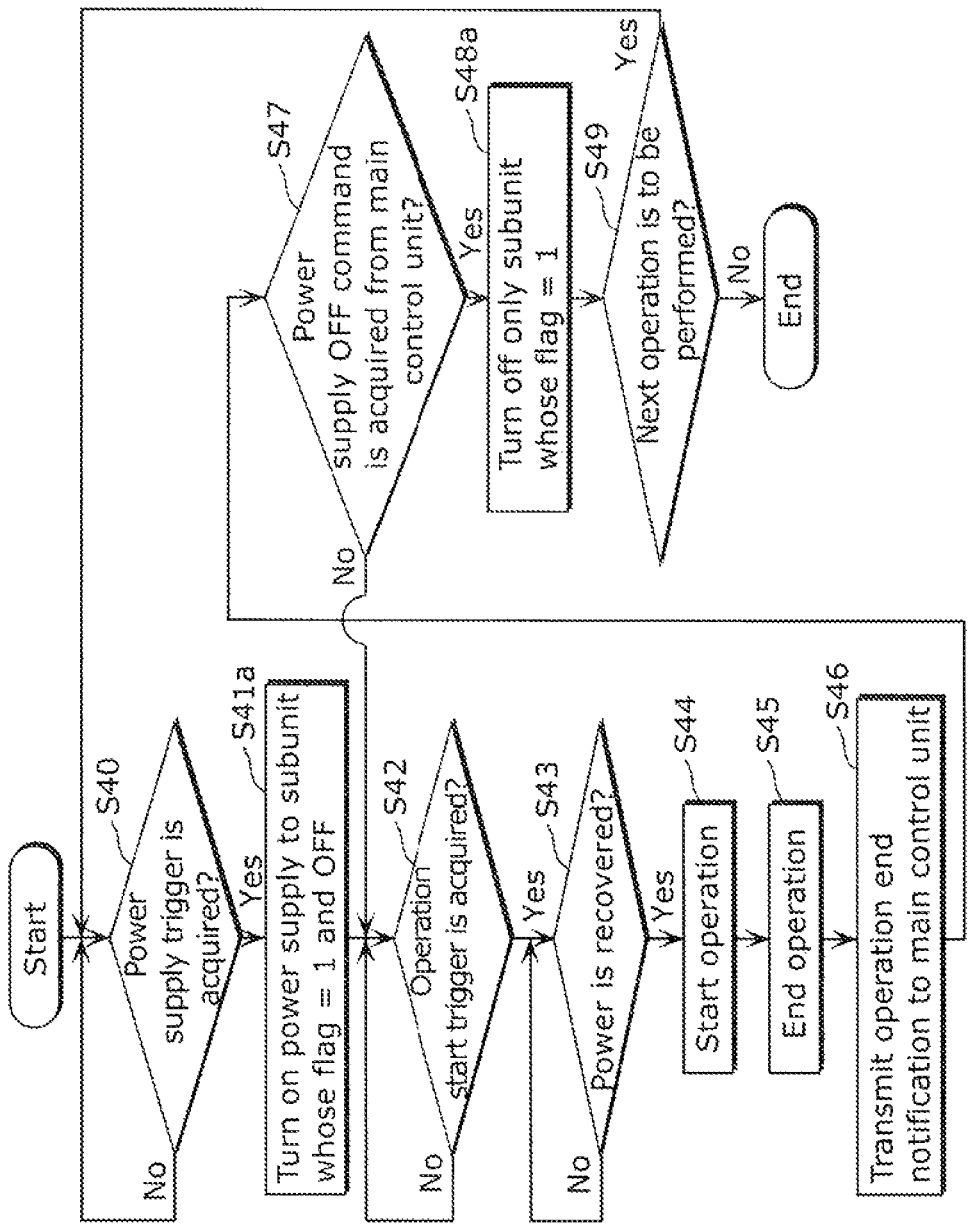
FIG. 18 is a flow diagram showing one example of a flow of processing performed by the mounting unit shown in FIG. 16.

FIG. 18 is a flow diagram showing one example of a flow of the processing performed by the mounting unit 160 shown in FIG. 16.

The flow of the processing shown in FIG. 18, compared to the processing flow shown in FIG. 10, differs therefrom only in the processing of S41a and S48a, and thus the processing of S41a and S48a will be mainly described here.

When the third control section 161 has acquired the power supply OFF command from the main control unit 110 (Yes in S47), the power supply control section 167 refers to the subunit information 200 and turns off the power supply for only the subunit for which the flag is "1" (S48a).

Specifically, if the subunit information 200 is a content shown in FIG. 17, the power supply to the X-direction driving section 176, the Y-direction driving section 177, and the rotation driving section 179 is turned OFF and the power supply to the Z-direction driving section 178 is kept ON.

Then when the third control section 161 has acquired the power supply trigger from the main control unit 110 (S40), the power supply control section 167 turns on the power supply to the subunits (the X-direction driving section 176, the Y-direction driving section 177, and the rotation driving section 179 in this example) for which the flag is 1 and to which the power supply is turned off (S41a).

As described above, for the given unit forming the production system, even if it has been determined to turn off the power supply, the power supply to at least one of the subunits included in this unit may be kept ON.

As a result, for example, while suppressing the deterioration in the production efficiency, the power consumption reduction can be promoted.

Referring to FIGS. 16 to 18, ON/OFF control of the power supply for each subunit by the mounting unit 160 has been described, but the ON/OFF control of the power supply for each subunit may be executed in the different kind of unit. For example, the conveyance unit 120 and the component supply unit 140 may perform the aforementioned ON/OFF control of the power supply for each subunit.

Moreover, for example, in the first component mounting machine 1100 according to Embodiment 3, even when it has been determined to turn off the power supply to the first power section 135, the control section 110 may keep ON the power supply to, for example, the mounting unit as the subunit.

Moreover, the subunit information 200 may be updated when necessary. As a result, even in a case where there arises a change in the function, capability, etc. of each subunit (for example, in a case where the operation of each subunit has been improved), appropriate ON/OFF control of the power supply for each subunit is ensured.

Moreover, the ON/OFF control of the power supply for each subunit may be executed without referring to the subunit information 200. For example, a mechanism of ignoring instructions for turning off the power supply on a side of the subunit for which it is not permitted to stop the power supply may be realized by hardware or software.

Specifically, a control may be performed such that, in a case where the given unit has a plurality of subunits and where it has been determined to stop the power supply for operation of this unit, the unit stops the power supply of at least one of the subunits and does not stop the power supply of at least another one of the subunits Moreover, at a time point of the determination on whether or not to turn off the power supply for the operation of the given unit (for example, the determination performed by the main control unit 110 according to Embodiment 1 or the determination performed by the first control section 121 to the third control section 161 according to Embodiment 2), for each of the plurality of subjects included in this unit, it may be determined whether or not to turn off the power supply. That is, a target of the power supply OFF determination processing may be an individual unit performing predetermined operation or an individual subunit partially in charge of the predetermined operation.

The power supply control method and the production system of the invention have been described above, based on Embodiments 1 to 3 and their supplementary description. However, the invention is not limited to these embodiments and their supplementary description. Without departing from the spirits of the invention, various modifications to the embodiments and their supplementary description thought by those skilled in the art or any combination of the plurality of components described above are also included in the scope of the invention.

For example, in Embodiment 3, each component mounting machine determines whether or not to turn off the power supply for its own component mounting operation. However, for example, the power supply OFF determination processing for each component mounting machine may be collectively performed by an external control device such as a computer that controls the operation of each component mounting machine.

Moreover, each component mounting machine according to Embodiment 3, as is the case with the component mounting machine 100 according to Embodiment 1 or the component mounting machine 101 according to Embodiment 2, may perform the power supply OFF determination processing for each individual element of, for example, the conveyance unit 120.

Specifically, each component mounting machine according to Embodiment 3 may determine whether or not it is permitted to turn off the power supply as its entire own machine and may also determine whether or not it is permitted to turn off the power supply for each individual unit. This makes it possible to increase the amount of power consumption reduction.

Moreover, in the component mounting machine 100 according to Embodiment 1, the main control unit 110 performs the power supply OFF determination processing of each unit, and the control sections (121, 141, and 161) of the respective units control the operation of the power sections (135, 155, and 175).

However, for example, the main control unit 110 may perform the control of the operation of the power sections (135, 155, and 175) of the respective units in addition to the power supply OFF determination processing of each unit. That is, in the component mounting machine 100, the main control unit 110 may control all the control of each unit.

INDUSTRIAL APPLICABILITY

According to the present invention, without deteriorating production efficiency of a production system that produces a component mounting board by repeatedly starting and stopping operation in a coordinated manner by a plurality of units, power consumption reduction can be increased.

Therefore, the invention is useful as, for example, a production system that produces a component mounting board and a power supply control method in a the production system that produces a component mounting board.

REFERENCE SIGNS LIST

20 Board
100, 101 Component mounting machine
110 Main control unit
111 Power supply trigger communication section
112 Operation start trigger communication section
113 Operation end notification acquisition section
114, 132, 1132 Power supply OFF determination section
115, 131, 1131 Operation time management section
116 Power supply OFF command section
120 Conveyance unit
121 First control section
122, 1122 Power supply trigger acquisition section
123, 1123 Operation start trigger acquisition section
124, 1124 Power supply trigger transmission section
125, 1125 Operation start trigger transmission section
126 Power supply OFF command acquisition section
127, 167, 1127 Power supply control section
128, 1128 Operation control section
129 Operation end notification transmission section
135 First power section
140 Component supply unit
141 Second control section
155 Second power section
160 Mounting unit
161 Third control section
165 Mounting head
175 Third power section
176 X-direction driving section
177 Y-direction driving section
178 Z-direction driving section
179 Rotation driving section
1000 Component mounting board production system
1100 First component mounting machine
1110, 1210, 1310 Control section
1135, 1235, 1335 Power section
1200 Second component mounting machine
1300 Third component mounting machine

The invention claimed is:
1. A power supply control method of a production system including a first unit and a second unit that produce a component mounting board by repeatedly starting and stopping operation in a coordinated manner, said power supply control method comprising:
starting power supply for the operation of the second unit in accordance with a signal acquired according to an operation status of the first unit;
starting the operation by the second unit after the start of the power supply;
previously acquiring stop time information indicating time from when the operation ends to when a next operation of the second unit starts;
determining, based on the acquired stop time information, whether or not to stop the power supply after the started operation ends; and
stopping the power supply when it is determined to stop the power supply.

2. The power supply control method according to claim 1, wherein, in said determining, it is determined to stop the power supply when the time indicated by the stop time information is longer than a predetermined threshold value.

3. The power supply control method according to claim 2, wherein, in said determining, it is determined to stop the power supply when the time indicated by the stop time information is longer than a sum, as the predetermined value, of (a) time required for stopping the power supply and (b) time required for the second unit to become operable after the start of the power supply.

4. The power supply control method according to claim 1, further comprising
restarting, in accordance with a signal transmitted from the first unit after the power supply is stopped in said stopping, the power supply before timing that is ahead of supposed timing of starting the next operation by time corresponding to the time required for the second unit to become operable after the start of the power supply.

5. The power supply control method according to claim 1, wherein the second unit has a plurality of subunits each partially in charge of the operation of the second unit, and
in said stopping, the power supply to at least one of the plurality of subunits is stopped and the power supply to at least another one of the subunits is not stopped.

6. The power supply control method according to claim 5, wherein in said stopping, subunit information indicating whether or not it is permitted to stop the power supply to each of the plurality of subunits is referenced, and the power supply to at least one of the subunits for which the subunit information indicates that it is permitted to stop the power supply is stopped, and the power supply to at least another one of the subunits for which the subunit information indicates that it is not permitted to stop the power supply is not stopped.

7. A production system including a first unit and a second unit that produce a component mounting board by repeatedly starting and stopping operation in a coordinated manner, said production system comprising:
a power supply control section configured to start power supply for the operation of the second unit in accordance with a signal acquired according to an operation status of the first unit;
an operation control section configured to cause the second unit to start the operation after the start of the power supply;
an operation time management section configured to previously acquire stop time information indicating time from when the operation ends to when the next operation of the second unit starts; and
a determination section configured to determine, based on the acquired stop time information, whether or not to stop the power supply after the started operation ends,
wherein said power supply control section is configured to stop the power supply when the determination section determines to stop the power supply.

\* \* \* \* \*